(12) United States Patent
Ahn et al.

(10) Patent No.: US 10,819,472 B2
(45) Date of Patent: Oct. 27, 2020

(54) METHOD FOR PERFORMING HARQ BY USING POLAR CODE HAVING RANDOM LENGTH

(71) Applicant: LG ELECTRONICS INC., Seoul (KR)

(72) Inventors: Joonkui Ahn, Seoul (KR); Byounghoon Kim, Seoul (KR); Il-Min Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 111 days.

(21) Appl. No.: 16/065,463

(22) PCT Filed: Dec. 9, 2016

(86) PCT No.: PCT/KR2016/014411
§ 371 (c)(1),
(2) Date: Jun. 22, 2018

(87) PCT Pub. No.: WO2017/111362
PCT Pub. Date: Jun. 29, 2017

(65) Prior Publication Data
US 2019/0028241 A1    Jan. 24, 2019

Related U.S. Application Data

(60) Provisional application No. 62/387,589, filed on Dec. 24, 2015.

(51) Int. Cl.
*H04L 1/18*        (2006.01)
*H03M 13/00*    (2006.01)
(Continued)

(52) U.S. Cl.
CPC .......... *H04L 1/1812* (2013.01); *H03M 13/05* (2013.01); *H03M 13/13* (2013.01);
(Continued)

(58) Field of Classification Search
CPC ... H04L 1/1812; H04L 1/0068; H04L 1/0057; H04L 1/1819; H03M 13/13; H03M 13/6362; H03M 13/05; H03M 13/6306
See application file for complete search history.

(56) References Cited

U.S. PATENT DOCUMENTS

| 9,137,492 B2 * | 9/2015 | Lima ..................... H04L 1/1812 |
| 2010/0088570 A1 * | 4/2010 | Choi ..................... H04L 1/1812 |
| | | 714/751 |

(Continued)

FOREIGN PATENT DOCUMENTS

WO    2015-026148 A1    2/2015

OTHER PUBLICATIONS

Chen, et al.; "Polar Coded HARQ Scheme with Chase Combining"; arXiv:1310.6650v2; Jan. 10, 2014.
(Continued)

*Primary Examiner* — April Y Blair
*Assistant Examiner* — Rong Tang
(74) *Attorney, Agent, or Firm* — Dentons US LLP

(57) ABSTRACT

The present specification provides a method for performing a physical layer security-based hybrid automatic repeat request (HARQ). The method comprises the steps of: generating a first code comprising information bits for forming data to be transmitted, and non-information bits which are unrelated to the data to be transmitted; generating a second code, having a length which differs from that of the first code, by puncturing the first code; determining locations of the information bits and non-information bits within the second code such that a variance of mutual information for each of the information bits and the non-information bits is maximized; and performing the HARQ by using the second code in which the locations of the information bits and the non-information bits are determined.

4 Claims, 20 Drawing Sheets

(51) Int. Cl.
*H03M 13/05* (2006.01)
*H03M 13/13* (2006.01)
*H04L 1/00* (2006.01)

(52) U.S. Cl.
CPC ... *H03M 13/6306* (2013.01); *H03M 13/6362* (2013.01); *H04L 1/0057* (2013.01); *H04L 1/0068* (2013.01); *H04L 1/1819* (2013.01)

(56) References Cited

U.S. PATENT DOCUMENTS

2014/0108748 A1* 4/2014 Lee .................... H03M 13/1111
711/154
2016/0285479 A1* 9/2016 El-Khamy ........ H03M 13/6368

OTHER PUBLICATIONS

El-Khamy, et al.; "Rate-Compatible Polar Codes for Wireless Channels"; arXiv:1508.07698v1; Aug. 31, 2015.
Chen, et al.; "A Hybrid ARC Scheme Based on Polar Codes"; arXiv:1307.2800v1; Jul. 10, 2013.

* cited by examiner

FIG. 2
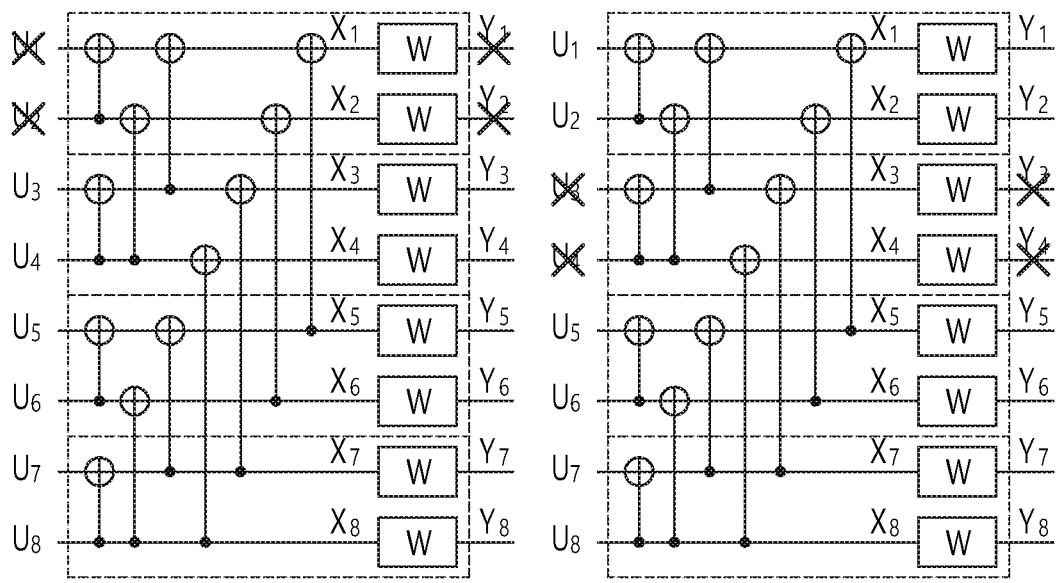
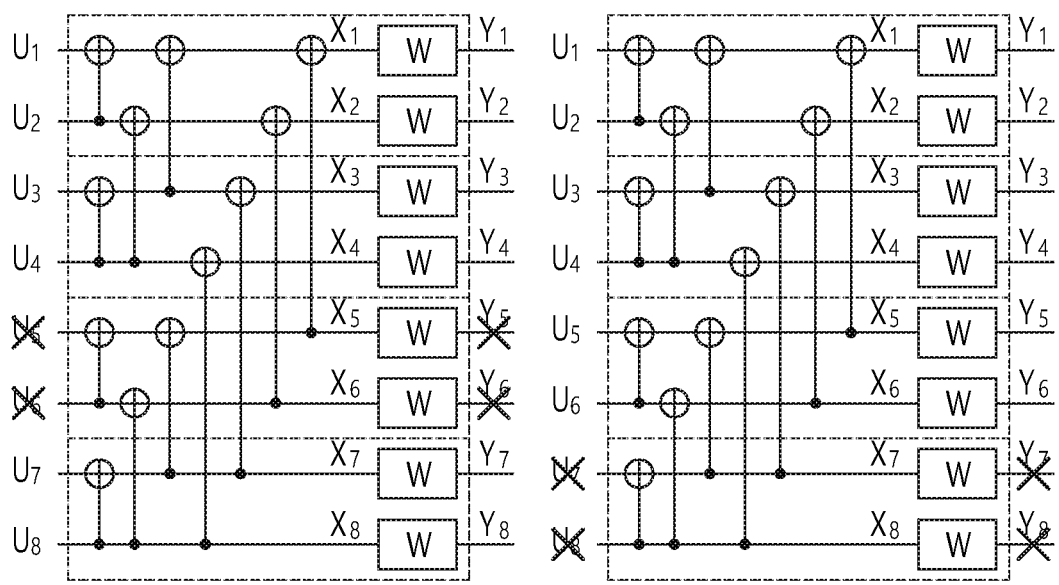

METHOD FOR PERFORMING HARQ BY USING POLAR CODE HAVING RANDOM LENGTH

This application is a 35 USC § 371 National Stage entry of International Application No. PCT/KR2016/014411, filed on Dec. 9, 2016, and claims priority to U.S. Provisional Application No. 62/387,589, filed on Dec. 24, 2015, all of which are incorporated by reference in their entirety herein.

BACKGROUND OF THE INVENTION

Field of the invention

The present invention relates to wireless communications. More particularly, the present invention relates to secure communications using polar codes.

Related Art

It is important to transfer data without error from a transmitter to a receiver in a data communication system. In 1948, Shannon mathematically investigated a limitation of a maximum data transfer rate at which data can be transferred without error, which is called channel capacity. In order to implement a real communication system close to the channel capacity, an error correction code having implementable complexity must exist. Several types of error correction codes have been developed since 1948, and turbo codes and low density parity check (LDPC) or the like have been developed relatively recently as error correction codes which exhibit performance close to channel capacity of Shannon. However, although these codes exhibit performance close to the channel capacity of Shannon, accurate channel capacity is not achieved. A polar code has recently been developed as a code which completely satisfies the channel capacity mathematically while satisfying such a problem.

Meanwhile, one of important methods for transmitting data without error by using an error correction code is Hybrid Automatic Repeat reQuest (HARQ). In the conventional Automatic Repeat reQuest (ARQ) scheme, when a receiver receives a packet transmitted by a transmitter without error, the receiver transmits ACK through a feedback channel, and the transmitter transmits a next packet for carrying new data. However, if there is an error in the packet received by the receiver, the receiver discards the erroneous packet and transmits NACK through the feedback channel, and the transmitter retransmits the previously transmitted packet.

HARQ which is evolved from the existing ARQ scheme is a scheme in which transmission data is transmitted after coding it by using an error correction code when the transmitter transmits data. When NACK is received from the receiver through the feedback channel, the transmitter may retransmit the same packet as the previously transmitted packet or may transmit only new code bits. Instead of discarding the erroneous packet, the receiver effectively decodes data by combining information in the erroneous packet and information in the newly received packet. The HARQ scheme may be performed in combination with several error correction codes.

In addition to transferring of data from a transmitting end to a receiving end without error through a channel, it is important in a communication system to allow only authenticated receivers to decode the transmitted data and not to allow other unauthenticated receivers to decode the data. Such a communication security problem has been conventionally solved by sharing the same security key between the transmitter and the receiver according to cryptography. For communication security based on the cryptography, a sufficiently strong security key must be generated, the generated security key must be securely distributed to the transmitter/receiver, and the security key must be periodically updated and managed. However, in general, a method of generating, distributing, and managing the security key is not simple. In particular, it is not easy for several types of wireless networks to reliably perform communication by generating and distributing the security key within a short time.

In order to solve this problem, a new approach has been studied to achieve communication security, which is called physical layer security. The physical layer security achieves communication security at a physical layer, not at an upper layer as in cryptography. One of the most effective ways to provide substantial communication security based on the physical layer security is to use a polar code.

Recently, studies on the polar code have been actively conducted in academia and industry. One topic of them is to realize a polar code having a random code length. Basically, a length of the polar code may be given as a square of 2. For example, a polar code having a length of $2^8=256$ or $2^9=512$ can be realized, but a polar code having a random length longer than 256 and shorter than 512 cannot be generated in an original construction manner. In addition, although several schemes have been proposed to realize the polar code having the random length, it is difficult to consider them as optimal polar code construction schemes since these schemes are not optimized in terms of mutual information which is an ultimate performance indicator of the communication system. In addition, it is difficult to apply the existing schemes for constructing the polar code having the random length to physical layer communication.

Meanwhile, various studies have been conducted on a polar coding-based HARQ scheme which combines polar coding and HARQ. However, according to the schemes proposed up to now, the polar code has not been constructed to improve information of channel polarization which is basic concept of polar coding. The schemes proposed up to now have a problem in that an information bit to be retransmitted is not coded when the information bit is retransmitted based on a repetition coding scheme. In addition, the schemes proposed up to now have a limitation in that performance of the polar coding-based HARQ is not optimized in terms of mutual information, and has not been developed for physical layer security communication.

SUMMARY OF THE INVENTION

A disclosure of the present specification aims to provide a method of generating a polar code having a random length optimized in terms of mutual information so as to be suitable to physical layer security communication.

Another disclosure of the present specification aims to provide a method of performing a hybrid automatic repeat request (HARQ) by using a polar code having a random length optimized in terms of mutual information.

To achieve the aforementioned purpose, a disclosure of the present specification provides a method of performing a HARQ based on physical layer security. The method may include: generating a second code having a length different from that of a first code by puncturing the first code including an information bit constituting data to be transmitted and a non-information bit irrelevant to the data to be transmitted; determining locations of the information bit and non-information bit in the second code; applying the determined locations of the information bit and non-information bit determined based on the second code to the first code; and performing the HARQ by using a packet generated by splitting the first code.

In the generating of the second code, mutual information may be calculated based on a probability distribution of a log likelihood ratio (LLR) for the first code, and the first code is punctured to decrease a loss of the calculated mutual information. In this case, the probability distribution of the LLR may be calculated by using Gaussian approximation.

In the determining of the locations of the information bit and the non-information bit, the locations of the information bit and the non-information bit may be determined to minimize a variance of mutual information for each of the information bit and the non-information bit.

In addition, a ratio of the information bit and non-information bit included in the second code may be determined by an indication signal previously received.

In order to achieve the aforementioned purpose, another disclosure of the present specification provides an apparatus for performing HARQ based on physical layer security. The apparatus may include: a radio frequency (RF) unit transmitting and receiving a radio signal; and a processor controlling the RF unit. The processor may be configured to: generate a second code having a length different from that of a first code by puncturing the first code including an information bit constituting data to be transmitted and a non-information bit irrelevant to the data to be transmitted; determine locations of the information bit and non-information bit in the second code; apply the determined locations of the information bit and non-information bit determined based on the second code to the first code; and perform the HARQ by using a packet generated by splitting the first code.

According to a disclosure of the present specification, it is possible to construct a polar code having a random length optimized in terms of mutual information. In particular, it is possible to decrease a calculation amount required to construct the polar code having the random length by using a suboptimal code design scheme. In addition, it is possible to decrease a communication error and maintain communication security by extendedly applying the polar code having the random length to physical layer security communication.

In addition, it is possible to decrease a communication error and maintain communication security while decreasing a calculation amount required in HARQ, by performing the HARQ on the basis of the polar code having the random length optimized in terms of the mutual information.

BRIEF DESCRIPTION OF THE DRAWINGS

FIG. 2 shows an example of four cases considered when polar code sub-optimization is performed when N=8, M=6, and Δ=2.

DESCRIPTION OF EXEMPLARY EMBODIMENTS

Figure 1:
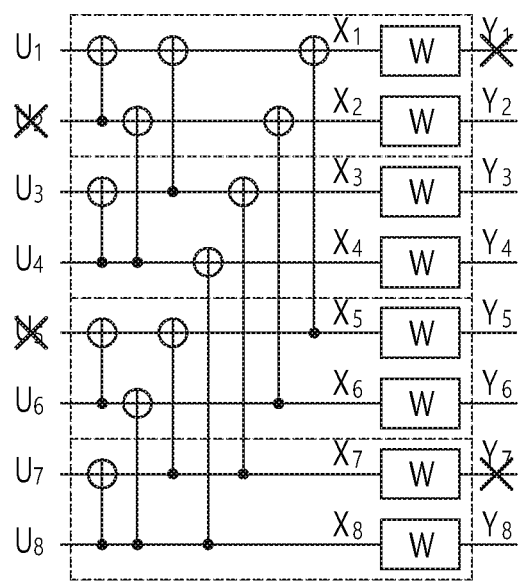
FIG. 1 shows an example of a mother code having a length of 8 and a punctured code having a length of 6.

The technical terms used herein are used to merely describe specific embodiments and should not be construed as limiting the present invention. Further, the technical terms used herein should be, unless defined otherwise, interpreted as having meanings generally understood by those skilled in the art but not too broadly or too narrowly. Further, the technical terms used herein, which are determined not to exactly represent the spirit of the invention, should be replaced by or understood by such technical terms as being able to be exactly understood by those skilled in the art. Further, the general terms used herein should be interpreted in the context as defined in the dictionary, but not in an excessively narrowed manner.

The expression of the singular number in the specification includes the meaning of the plural number unless the meaning of the singular number is definitely different from that of the plural number in the context. In the following description, the term 'include' or 'have' may represent the existence of a feature, a number, a step, an operation, a component, a part or the combination thereof described in the specification, and may not exclude the existence or addition of another feature, another number, another step, another operation, another component, another part or the combination thereof.

The terms 'first' and 'second' are used for the purpose of explanation about various components, and the components are not limited to the terms 'first' and 'second'. The terms 'first' and 'second' are only used to distinguish one component from another component. For example, a first component may be named as a second component without deviating from the scope of the present invention.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present.

Hereinafter, exemplary embodiments of the present invention will be described in greater detail with reference to the accompanying drawings. In describing the present invention, for ease of understanding, the same reference numerals are used to denote the same components throughout the drawings, and repetitive description on the same components will be omitted. Detailed description on well-known arts which are determined to make the gist of the invention unclear will be omitted. The accompanying drawings are provided to merely make the spirit of the invention readily understood, but not should be intended to be limiting of the invention. It should be understood that the spirit of the invention may be expanded to its modifications, replacements or equivalents in addition to what is shown in the drawings.

Hereinafter, the present specification proposes two schemes related to polar coding for transmitting data without error. First, it is proposed a scheme for optimally constructing a polar code having a random length. In addition, it is proposed to extendedly apply a polar code having a limited random length to physical layer security communication. Second, it is proposed an HARQ scheme based on polar coding capable of effectively transmitting data by using the constructed polar code. In addition, it is proposed a scheme of extendedly applying the proposed polar coding-based HARQ scheme to the physical layer security communication.

1. Scheme of Constructing Polar Code Having Random Length

First, it is considered a case of constructing a polar code having a random length M. To construct the polar code having the length M, a mother code having a length $N=2^n$ may be punctured. In this case, n denotes a natural number, and N and M are related as follows.

$$\frac{N}{2} = 2^{n-1} < M < N = 2^n \quad \text{[Equation 1]}$$

If $T_M$ denotes a set of indices of M symbols before being subjected to coding without puncturing, the following relationship is satisfied.

$$\mathcal{T}_M \subset \mathcal{T}_N = \{1, 2, \ldots N\} \quad \text{[Equation 2]}$$

In addition, if a code $R_M$ denotes an index set of M symbols to be transmitted after being subjected to coding without puncturing, $R_M$ is eventually equal to a set of indices of symbols received in a receiving end, and the following relationship is satisfied.

$$\mathcal{R}_M \subset \mathcal{T}_N = \{1, 2, \ldots, N\} \quad \text{[Equation 3]}$$

FIG. 1 shows an example of a mother code having a length of 8 and a punctured code having a length of 6.

One example of constructing a polar coding having a length of M=6 from a polar code having a length of N=8 is shown in FIG. 1. An index set $T_N$ of all symbols of the mother code is given by $T_N=\{1, 2, 3, 4, 5, 6, 7, 8\}$. A set of 6 symbols before being subjected to coding without puncturing is given by $\{\mu_1, \mu_3, \mu_4, \mu_6, \mu_7, \mu_8\}$, and thus $T_M$ is given by $T_M=\{1, 3, 4, 6, 7, 8\}$. In addition, a set of symbols to be transmitted after being subjected to coding without puncturing is given by $\{X_2, X_3, X_4, X_5, X_6, X_8\}$, and a set of coded symbols to be received in a receiving end is given by $\{Y_2, Y_3, Y_4, Y_5, Y_6, Y_8\}$. Therefore, a set $R_M$ is given by $R_M=\{2, 3, 4, 5, 6, 8\}$.

The construction of the polar code having the length of M is to determine the aforementioned $T_M$ and $R_M$ in an optimal manner. Upon determining the sets $T_M$ and $R_M$, M rows corresponding to $T_M$ is selected from an N×N polar code generation matrix $G_N$ of the mother code, and an M×M polar code generation matrix $(G_N)_{\mathcal{T}_M \mathcal{R}_M}$ is constructed.

1.1 Optimization of Polar Code Having Random Length

When constructing a code having a length M by puncturing (N−M) symbols from a mother code having a length N, there is a loss in mutual information. A code may be constructed through the following optimization so that the constructed length M has optimal performance in terms of the mutual information by minimizing the loss in the mutual information.

$$(\hat{\mathcal{T}}_M, \hat{\mathcal{R}}_M) = \arg\max_{\mathcal{T}_M, \mathcal{R}_M} I(U_{\mathcal{T}_M}; Y_{\mathcal{R}_M}), \mathcal{T}_M, \mathcal{R}_M \in \Psi_N^M \quad \text{[Equation 4]}$$

Herein, it is given by $U_{\mathcal{T}_M}=\{U_i : i \in \mathcal{T}_M\}$ and $Y_{\mathcal{R}_M}=\{Y_i : i \in \mathcal{R}_M\}$. That is, $I(U_{\mathcal{T}_M}; T_{\mathcal{R}_M})$ denotes mutual information of a generated polar code having a length M. In Equation 4, $\Psi_N^M$ denotes a set of all subsets having M elements of $T_N=\{1, 2, \ldots, N\}$. That is, $\Psi_N^M$ is given as follows.

$$\Psi_N^M = \{\{1,2,\ldots,M\},\{2,3,\ldots,M+1\},\ldots,\{1,3,4,\ldots,M+1\},\ldots\} \quad \text{[Equation 5]}$$

Therefore, the number of all subsets having M elements included in $\Psi_N^M$ is given by $$\binom{N}{M} = \frac{N!}{M!(N-M)!}.$$

However, optimization of the code by directly using the Equation 4 above is difficult due to the following reasons.

First, it is not easy to directly calculate the mutual information.

Second, although complexity of optimization using Equation 4 is, N and M are substantially great number. Therefore, it is difficult to perform substantial optimization.

Therefore, the present specification proposes a method of constructing an optimized polar code by solving the aforementioned problem.

First, the following result can be mathematically proved.

$$\hat{\mathcal{T}}_M = \hat{\mathcal{R}}_M \quad \text{[Equation 6]}$$

That is, when $T_M$ and $R_M$ are given identically, the Equation 4 above is optimized (that is, mutual information is maximized).

By using such a result, the optimization of the Equation 4 above may be simplified as follows.

$$\hat{\mathcal{T}}_M = \arg\max_{\mathcal{T}_M} I(U_{\mathcal{T}_M}; Y_{\mathcal{T}_M}), \mathcal{T}_M \in \Psi_N^M \quad \text{[Equation 7]}$$

As such, complexity of simplified optimization is $$\binom{N}{M},$$

and may be significantly lower than optimization complexity $$\binom{N}{M} \times \binom{N}{M}$$

based on the previous Equation 4.

However, the optimization based on the Equation 7 above still has the following two problems.

First, it is not easy to directly calculate the mutual information

Second, although complexity of the optimization using Equation 7 is, N and M are substantially great number. Therefore, it is still difficult to perform substantial optimization.

Hereinafter, a method of calculating the mutual information is proposed to solve the first problem. First, a log likelihood ratio (LLR) $L_i(\cdot)$ for a current input symbol $U_i$ is defined. In a polar code, the LLR is given as a function of all outputs $Y_1^N$ and previous inputs $U_1^{i-1}$. Since the LLR has sufficient statistics for $U_i$, total mutual information in a polar code having a length N may be as follows.

$$I(U_{\mathcal{T}_N}; Y_{\mathcal{T}_N}) = \sum_{i=1}^{N} I(U_i; Y_N \mid U_1^{i-1}) \qquad \text{[Equation 8]}$$

$$= \sum_{i=1}^{N} I(U_i; \mathcal{L}(Y_{\mathcal{T}_N} \mid U_1^{i-1}))$$

$$= \sum_{i=1}^{N} I(U_i; \mathcal{L}_i(\mathcal{T}_N))$$

Herein, $L_i(T_N)$ may be defined as follows.

$$\mathcal{L}_i(\mathcal{T}_N) := \mathcal{L}(Y_{\mathcal{T}_N} \mid U_1^{i-1}) \qquad \text{[Equation 9]}$$

Similarly, the mutual information in the polar code having the length M may be as follows.

$$I(U_{\mathcal{T}_M}; Y_{\mathcal{T}_M}) = \sum_{i=1}^{M} I(U_i; \mathcal{L}_i(\mathcal{T}_M)) \qquad \text{[Equation 10]}$$

Herein, $L_i(T_M)$ may be defined as follows.

$$\mathcal{L}_i(\mathcal{T}_M) = \mathcal{L}(Y_{\mathcal{T}_M} \mid U_1^{i-1}) \qquad \text{[Equation 11]}$$

Therefore, the optimization based on the Equation 7 above may be expressed as follows.

$$\hat{\mathcal{T}}_M = \operatorname*{argmax}_{\mathcal{T}_M} \sum_{i \in \mathcal{T}_M} I(U_i; \mathcal{L}_i(\mathcal{T}_M)), \mathcal{T}_M \in \Psi_N^M \qquad \text{[Equation 12]}$$

An average value $M_I(T_M)$ of the mutual information may be used to express the optimization of Equation 11 as follows.

$$\hat{\mathcal{T}}_M = \operatorname*{argmax}_{\mathcal{T}_M} M_I(\mathcal{T}_M), \mathcal{T}_M \in \Psi_N^M \qquad \text{[Equation 13]}$$

Herein, $M_I(T_M)$ is as follows.

$$M_I(\mathcal{T}_M) = \frac{1}{M} \cdot \sum_{i \in \mathcal{T}_M} I(U_i; \mathcal{L}_i(\mathcal{T}_M)) \qquad \text{[Equation 14]}$$

On the other hand, the mutual information between the input symbol $U_i$ and the LLR $L_i$ for the input symbol may be obtained as follows.

$$I(U_i; \mathcal{L}_i) = \mathbb{E}\left[\log_2\left(\frac{2}{1+e^{-\mathcal{L}_i}}\right) \mid U_i = 0\right] \qquad \text{[Equation 15]}$$

$$= \int_{-\infty}^{\infty} p\mathcal{L}_i(x \mid 0) \log_2\left(\frac{2}{1+e^{-x}}\right) dx$$

$$= 1 - \mathbb{E}[\log_2(1+e^{-\mathcal{L}_i}) \mid U_i = 0]$$

$$= 1 - \int_{-\infty}^{\infty} p\mathcal{L}_i(x \mid 0) \log_2(1+e^{-x}) dx$$

Herein, $pL_i(x)$ is a probability distribution function of $L_i$, and $pL_i(x|0)$ is a probability distribution of $L_i$ if a given condition is $U_i=0$. That is, the mutual information may be obtained if only the probability distribution function of LLR is given. The probability distribution function may be accurately obtained through density evolution (DE). However, since complexity required for DE is high, it may be obtained relatively accurately through Gaussian approximation. In this case, the mutual information may be expressed as follows. In the following equation, $\mu_i$ and $\sigma^2_i$ corresponding to the input symbol $U_i$ may be obtained through Gaussian approximation.

$$I(U_i; \mathcal{L}_i(\mathcal{T}_M)) = \mathbb{E}\left[\log_2\left(\frac{2}{1+e^{-\mathcal{L}_i(\mathcal{T}_M)}}\right) \mid U_i = 0\right], i \in \mathcal{T}_M \qquad \text{[Equation 16]}$$

$$= \int_{-\infty}^{\infty} \frac{1}{\sqrt{2\pi\sigma_i^2}} e^{-\frac{(x-\mu_i)^2}{2\sigma_i^2}} \log_2\left(\frac{2}{1+e^{-x}}\right) dx$$

1.2 Code Optimization for Maximizing Variance of Mutual Information

Basic concept of a polar code is to polarize mutual information of each bit channel. Therefore, when a code length is infinite in polar coding, mutual information of a bit channel corresponding to each input bit converges to 0 or 1, thereby maximizing a variance of mutual information of all bits.

When a polar code having a length M is constructed based on this basic concept of the polar code, the variance of the mutual information may be maximized as follows.

$$\hat{\mathcal{T}}_M = \operatorname*{argmax}_{\mathcal{T}_M} V_I(\mathcal{T}_M), \mathcal{T}_M \in \Psi_N^M \qquad \text{[Equation 17]}$$

Herein, $V_I(T_M)$ is a variance of mutual information given as follows.

$$V_I(\mathcal{T}_M) = \frac{1}{M} \sum_{i \in \mathcal{T}_M} I(U_i; \mathcal{L}_i(Y_{\mathcal{T}_M}))^2 - M_I(\mathcal{T}_M)^2 \quad \text{[Equation 18]}$$

Alternatively, it may be optimized as follows by using a variance value and average value of the mutual information.

$$\tilde{\mathcal{T}}_M = \underset{\mathcal{T}_M}{\operatorname{argmax}}\, M_I(\mathcal{T}_M) \text{ subject to } V_I(\mathcal{T}_M) \geq V_I^{Th}, \quad \text{[Equation 19]}$$

$$\mathcal{T}_M \in \Psi_N^M$$

1.3 Sub-Optimization of Polar Code Having Random Length

A method of calculating mutual information has been described up to now in regards to two problems related to optimization of a polar code. As described above, mutual information of LLR may be obtained through DE or Gaussian approximation.

Hereinafter, in order to solve the second problem, a method of obtaining a suboptimal solution when a code is designed is proposed in order to decrease complexity for code construction.

First, assume that $\Delta$ denotes a step size of the codelength. The followings are several examples of $\Delta$.

$\Delta = 512 \rightarrow N, M \in \{512, 1024, ...\}$ $\Delta = 256 \rightarrow N, M \in \{256, 512, 768, 1024, ...\}$ $\Delta = 128 \rightarrow N, M \in \{128, 256, 512, 640, 768, 896, 1024, ...\}$ $\Delta = 64 \rightarrow N, M \in \{64, 128, ..., 512, 576, 640, ..., 896, 960, 1024, ...\}$ $\Delta = 32 \rightarrow N, M \in \{32, 64, ..., 512, 576, ..., 960, 992, 1024, ...\}$

...

$\Delta = 1 \rightarrow N, M \in \{1, 2, 3, ..., 512, 513, 514, ..., 1022, 1023, 1024, ...\}$ As shown in the above example, if $\Delta=1$, it is possible to have all available code lengths. However, if $\Delta>1$, it may have a code length with an increment corresponding to the value $\Delta$. When polar codes having various lengths are constructed in a real environment, it is sufficient to design only codes having an increment of several constant lengths. Therefore, the value $\Delta$ may be determined by considering required several code length values when a code is designed in the real environment.

Assume that $$\Psi_{\frac{N}{\Delta}}^{\frac{M}{\Delta}}$$

is a set indicating all cases in which a polar code having a length M is constructed from a mother polar code having a length N through combination of small polar codes having a code length $\Delta$. The number $$\left|\Psi_{\frac{N}{\Delta}}^{\frac{M}{\Delta}}\right|$$

of the sets is as follows.

$$\left|\Psi_{\frac{N}{\Delta}}^{\frac{M}{\Delta}}\right| = \binom{\frac{N}{\Delta}}{\frac{M}{\Delta}} = \frac{\left(\frac{N}{\Delta}\right)!}{\left(\frac{M}{\Delta}\right)!\left(\frac{N-M}{\Delta}\right)!} \quad \text{[Equation 19]}$$

When constructing the polar code having the length M, a process of finding a suboptimal solution is as follows.

Step 1: The greatest common divisor of N and M is found.

Step 2: $\Delta$ is determined as the found greatest common divisor or one of values obtained by dividing the greatest common divisor by a natural number.

Step 3: A code for providing maximum mutual information is selected by finding mutual information for each case in the set $$\Psi_{\frac{N}{\Delta}}^{\frac{M}{\Delta}}$$

in order to construct the polar code having the length M.

The optimization may be expressed by any one of Equations 20 to 22 as follows.

$$\tilde{\mathcal{T}}_M = \underset{\mathcal{T}_M}{\operatorname{argmax}} M_I(\mathcal{T}_M), \mathcal{T}_M \in \Psi_{\frac{N}{\Delta}}^{\frac{M}{\Delta}} \quad \text{[Equation 20]}$$

$$\tilde{\mathcal{T}}_M = \underset{\mathcal{T}_M}{\operatorname{argmax}} V_I(\mathcal{T}_M), \mathcal{T}_M \in \Psi_{\frac{N}{\Delta}}^{\frac{M}{\Delta}} \quad \text{[Equation 21]}$$

$$\tilde{\mathcal{T}}_M = \underset{\mathcal{T}_M}{\operatorname{argmax}} M_I(\mathcal{T}_M) \text{ subject to } V_I(\mathcal{T}_M) \geq V_I^{Th}, \quad \text{[Equation 22]}$$

$$\mathcal{T}_M \in \tilde{\Psi}_{\frac{N}{\Delta}}^{\frac{M}{\Delta}}$$

To facilitate the understanding for the code construction process, two examples are described below.

Example 1

When N=8 and M=6

Figure 3:
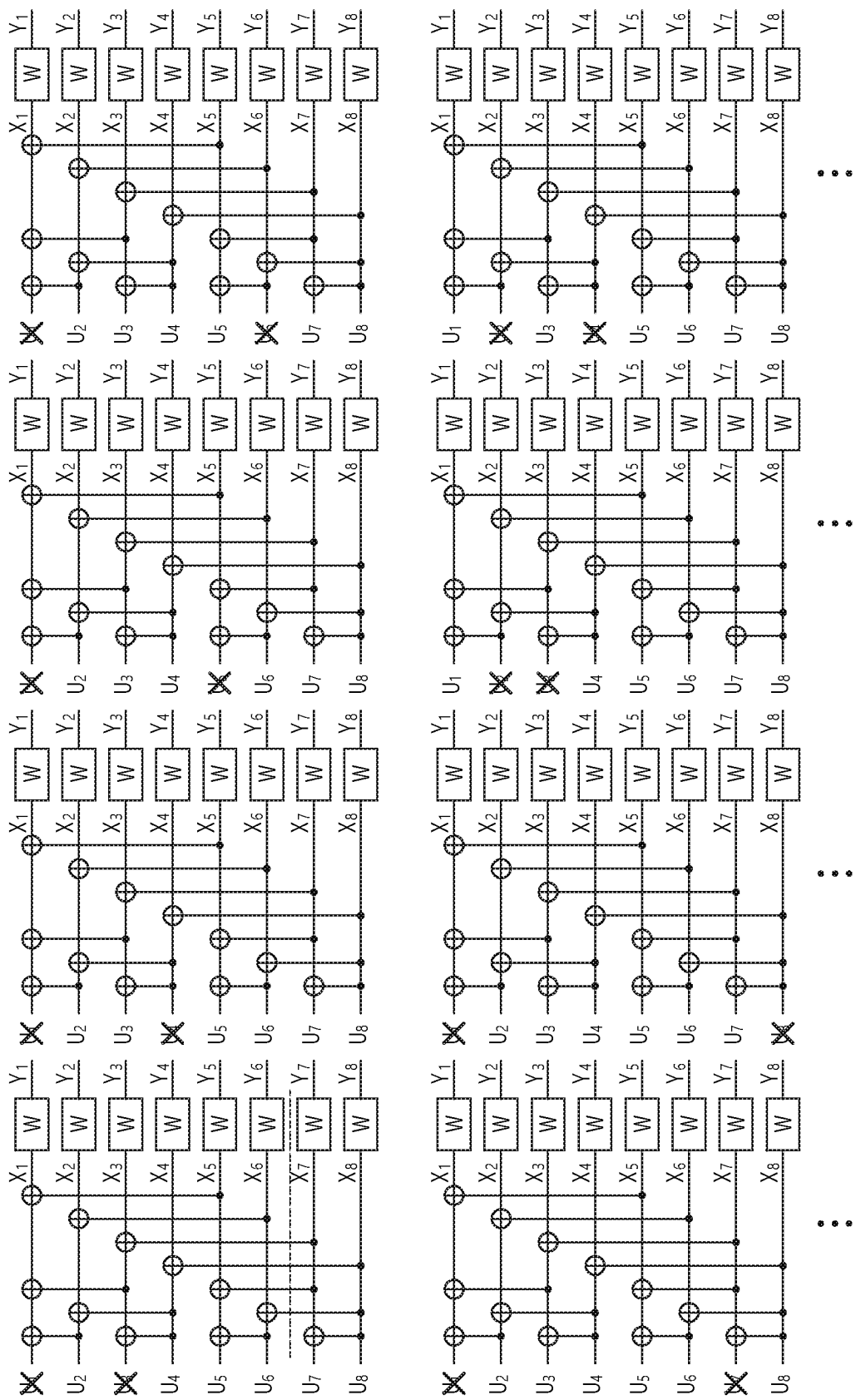
FIG. 3 shows cases considered when optimization of a polar code is performed and not considered when sub-optimization is performed.

FIG. 2 shows an example of four cases considered when polar code sub-optimization is performed when N=8, M=6, and $\Delta=2$. In addition, FIG. 3 shows an example of cases considered when polar code optimization is performed and not considered when sub-optimization is performed when N=8, M=6, and $\Delta=2$.

When N=8 and M=6, the greatest common divisor of the two values is 2, and thus $\Delta=2$. In this case, original optimization complexity is as follows.

$$|\Psi_N^M| = \binom{8}{6} = 32 \quad \text{[Equation 23]}$$

Complexity of sub-optimization is as follows.

$$\left|\Psi_{\frac{N}{\Delta}}^{M}\right| = \binom{4}{3} = 4 \quad \text{[Equation 24]}$$

A mutual information is obtained for each of four cases considered in sub-optimization illustrated in FIG. 2. In addition, a case of having the maximum mutual information is selected among the obtained mutual information. In addition, the same code as in the selected case is constructed. FIG. 3 shows cases considered when optimization of a polar code is performed and not considered when sub-optimization is performed.

Example 2

When N=8 and M=4

Figure 4:
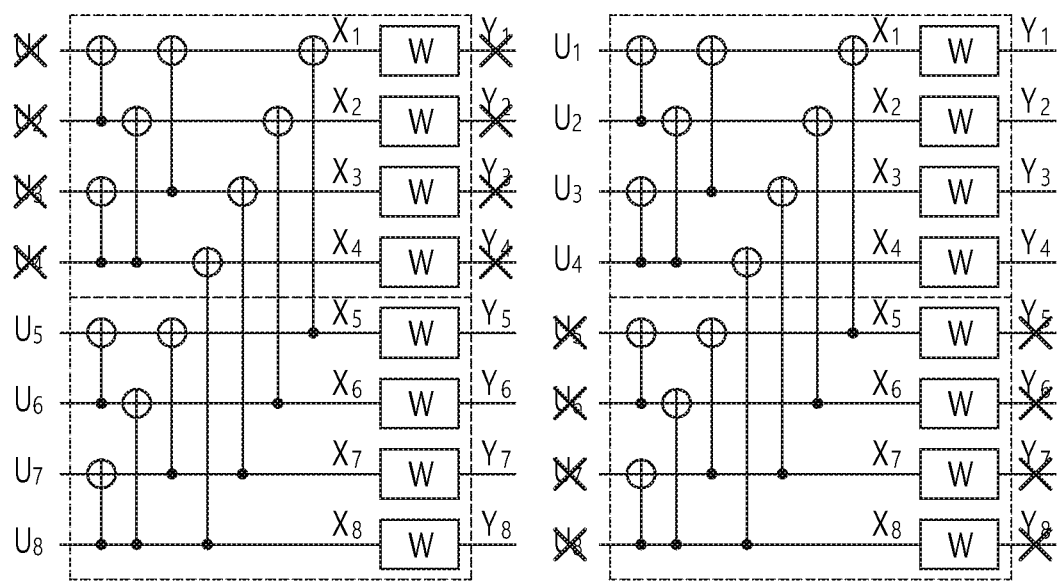
FIG. 4 shows two cases where mutual information is calculated in polar code sub-optimization when N=8, M=4, and Δ=4.
Figure 5:
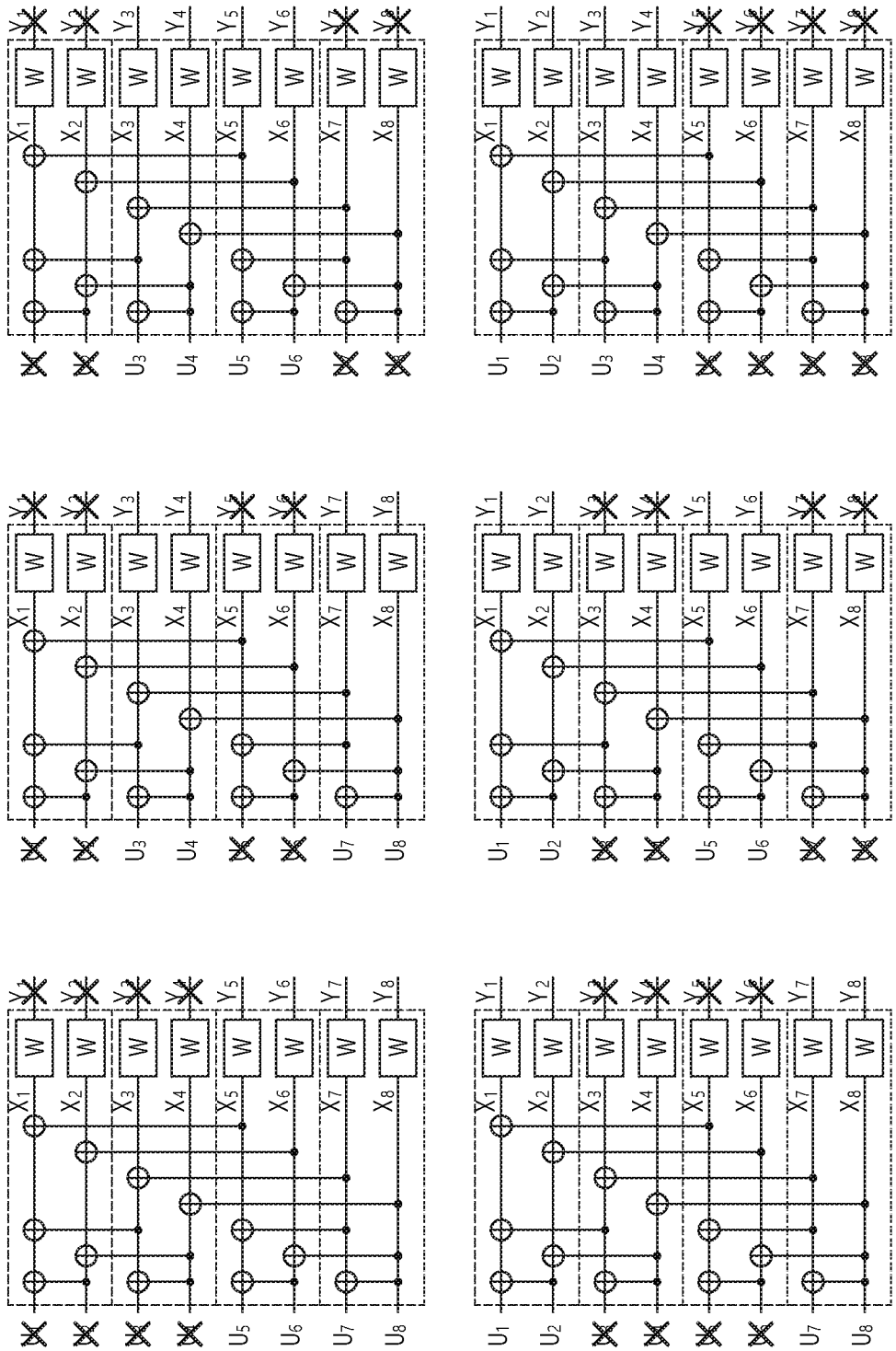
FIG. 5 shows an example of six cases where mutual information is calculated in polar code sub-optimization when N=8, M=4, and Δ=2.

FIG. 4 shows two cases where mutual information is calculated in polar code sub-optimization when N=8, M=4, and Δ=4. In addition, FIG. 5 shows an example of six cases where mutual information is calculated in polar code sub-optimization when N=8, M=4, and Δ=2.

When N=8 and M=6, the greatest common divisor of the two values is 4. Therefore, cases where Δ=2 and Δ=4 are considered. For each case, complexity required for sub-optimization is as follows.

$$\text{When } \Delta = 4, \left|\Psi_{\frac{N}{\Delta}}^{M}\right| = \binom{2}{1} = 2 \quad \text{[Equation 25]}$$

$$\text{When } \Delta = 2, \left|\Psi_{\frac{N}{\Delta}}^{M}\right| = \binom{4}{2} = 6$$

FIG. 4 and FIG. 5 show cases where mutual information is calculated in polar code sub-optimization when N=8, M=4, and Δ=4 and when N=8, M=4, and Δ=2.

2. Method of Constructing Polar Code Having Random Length for Physical Layer Security It is described a method by which the aforementioned scheme of constructing a polar code having a random length is applied extendedly to physical layer security communication. An ultimate performance indicator in the physical layer security is secrecy capacity. The secrecy capacity is determined as a difference between channel capacity of a receiver which desires to receive data and an eavesdropper which desires not to receive data. Hereinafter, for convenience of explanation, a transmitter which transmits data is denoted by Alice, a receiver which desires to receive data is denoted by Bob, and an eavesdropper which desires not to receive data is denoted by Eve.

The secrecy capacity has a meaningful positive (+) value only when channel capacity of Bob is greater than channel capacity of Eve. If the channel capacity of Eve is greater than the channel capacity of Bob, the secrecy capacity is 0. By using the secrecy capacity as a performance indicator, the following optimization is performed to construct a polar code having a length M.

$$\tilde{\mathcal{T}}_M = \underset{\mathcal{T}_M}{\operatorname{argmax}} \sum_{i \in \mathcal{T}_M} (I_b(U_i; \mathcal{L}_i(\mathcal{T}_M)) - I_e(U_i; \mathcal{L}_i(\mathcal{T}_M)))^+, \quad \text{[Equation 26]}$$

$$\mathcal{T}_M \in \Psi_N^M$$

Herein, $I_b(\cdot)$ denotes channel capacity (or mutual information) of Bob, and $I_e(\cdot)$ denotes channel capacity (or mutual information) of Eve. In addition, the function $(x)^+$ is defined as follows.

$$(x)^+ = \begin{cases} x, & \text{if } x > 0 \\ 0, & \text{otherwise} \end{cases} \quad \text{[Equation 27]}$$

The mutual information for Bob and Eve may be calculated by a method using the aforementioned LLR.

If the length of the polar code is infinitely long and thus channel polarization is completely achieved, a security polar code may be effectively constructed through optimization according to Equation 26. However, if the length of the polar code is finite and thus the channel polarization is not completely achieved, channel capacity calculated through optimization according to Equation 26 may not have a meaning of a transfer rate for transmitting data while maintaining security substantially without error. In order to transmit data to Bob without error, mutual information of Bob must be very close to 1, and in order to transmit data to Bob while maintaining security, mutual information of Eve must be very close to 0.

The following descriptions are several examples for a possibility of maintaining security on the basis of the mutual information of Bob and Eve.

Example 3.1

$I_b (I_i; L_i(T_M))$=0.6, $I_e (U_i; L_i(T_M))$=0.3

In this case, data decoded by Bob may have an error. In addition, security for Eve is not maintained. That is, Eve may also decode a part of data.

Example 3.2

$I_b (U_i; L_i(T_M))$=0.9999, $I_e(U_i; L_i(T_M))$=0.3

In this case, data decoded by Bob has almost no error. However, security for Eve is not maintained.

Example 3.3

$I_b (U_i; L_i(T_M))$=0.6, $I_e (U_i; L_i(T_M))$=0.0001

In this case, data decoded by Bob may have an error. However, security for Eve is maintained.

Example 3.4

$I_b (U_i; L_i(T_M))$=0.9999, $I_e (U_i; L_i(T_M))$=0.0001

In this case, data decoded by Bob has almost no error. In addition, security for Eve is maintained.

Considering the aforementioned examples 3.1 to 3.4, the secrecy capacity according to Equation 26 is calculated as follows.

$$\Sigma(I_b(U_i;\mathcal{L}_i(\mathcal{T}_M))-I_B(U_B;\mathcal{L}_i(\mathcal{T}_M)))=(0.6-0.3)+ \\ (0.9999-0.3)+(0.6-0.0001)+(0.9999-0.0001) \quad \text{[Equation 28]}$$

However, among the aforementioned four examples, the examples 3.1 to 3.3 are cases where data transmission has an error or security is not maintained. When the secrecy capacity is determined in practice, the examples 3.1 to 3.3 must be excluded. Therefore, Equation 26 may be modified as follows.

$$\tilde{\mathcal{T}}_M = \underset{\mathcal{T}_M}{\arg\max} \sum_{i \in \mathcal{T}_M} (I_b(U_i; \mathcal{L}_i(\mathcal{T}_M)) - I_e(U_i; \mathcal{L}_i(\mathcal{T}_M)))^{+\mu}, \quad \text{[Equation 29]}$$

$$\mathcal{T}_M \in \Psi_N^M$$

Herein, the function $(x)^+$ is as follows.

$$(x)^{+\mu} = \begin{cases} x, & \text{if } x \geq \mu \\ 0, & \text{otherwise} \end{cases} \quad \text{[Equation 30]}$$

Considering only a case where data transmission has no error and security is maintained, µ must be set to a value close to 1 in order to determine the secrecy capacity. For example, it may be set to µ=0.9999. The following is an example of calculating the secrecy capacity in the aforementioned example 3.1, by considering µ=0.9998.

$$\sum (I_b(U_i; \mathcal{L}_i(\mathcal{T}_M)) - I_e(U_i; \mathcal{L}_i(\mathcal{T}_M))^{+\mu} = \quad \text{[Equation 31]}$$
$$(0.6 - 0.3)^{+\mu} + (0.9999 - 0.3)^{+\mu} + (0.6 - 0.0001)^{+\mu} +$$
$$(0.9999 - 0.0001)^{+\mu} = (0.9999 - 0.0001)$$

2.1 Sub-Optimization of Polar Code Having Random Length for Physical Layer Security A sub-optimization method for decreasing complexity required when a polar code having a random length without consideration of physical layer security may also equally apply to a case where a security polar code is constructed by considering the physical layer security.

In this case, in order to determine optimal $T_M$, optimization is performed by considering only cases of being included in a set $$\Psi_{\frac{N}{\Delta}}^{\frac{M}{\Delta}},$$

instead of considering all cases of being included in a set $\Psi_N^M$. The optimization may be expressed by any one of the following Equations 32 and 33.

$$\tilde{\mathcal{T}}_M = \underset{\mathcal{T}_M}{\arg\max} \sum_{i \in \mathcal{T}_M} (I_b(U_i; \mathcal{L}_i(\mathcal{T}_M)) - I_e(U_i; \mathcal{L}_i(\mathcal{T}_M)))^+, \quad \text{[Equation 32]}$$

$$\mathcal{T}_M \in \Psi_{\frac{N}{\Delta}}^{\frac{M}{\Delta}}$$

$$\tilde{\mathcal{T}}_M = \underset{\mathcal{T}_M}{\arg\max} \sum_{i \in \mathcal{T}_M} (I_b(U_i; \mathcal{L}_i(\mathcal{T}_M)) - I_e(U_i; \mathcal{L}_i(\mathcal{T}_M)))^{+\mu}, \quad \text{[Equation 33]}$$

$$\mathcal{T}_M \in \Psi_{\frac{N}{\Delta}}^{\frac{M}{\Delta}}$$

3. HARQ Based on Polar Coding

A new HARQ scheme based on polar coding as described above will be described. First, it is defined that N denotes a length of a mother code, and K denotes the number of information bits included in the mother code. In addition, I denotes a set of information bits in the mother code, and Z denotes a set of frozen bits. In general, the frozen bit may use 0 (zero). N coded bits of the given mother code are divided into J sets, each set is represented by $\mathcal{G}_j$, j=1, 2, ..., J, and a size of each set is represented by $M_j$ as follows.

$$|\mathcal{G}_1|=M_1, |\mathcal{G}_2|=M_2, \ldots, |\mathcal{G}_J|=M_J$$

Herein, $\Sigma_{j=1}^J M_j = N$ is satisfied, and $\mathcal{G}_{l_1} \cap \mathcal{G}_{l_2} = \emptyset$, $l_1 \neq l_2$ is satisfied.

The transmitter transmits only coded bits belonging to $\mathcal{G}_1$ in initial transmission. Upon receiving NACK (or upon not receiving ACK) from the receiver, the transmitter transmits coded bits belonging to $\mathcal{G}_2$. Similarly, upon receiving NACK after transmitting coded bits belonging to $\mathcal{G}_j$, the transmitter transmits $\mathcal{G}_{j+1}$. In addition, if the transmitter receives ACK from the receiver, a new mother code is constructed to transmit next new information bits, and new HARQ is performed again.

3.1 HARQ Scheme 1

One way to construct an optimized HARQ scheme is to optimize $\mathcal{G}_j$ such that mutual information is maximized as follows.

$$\mathcal{G}_1^{opt} = \arg\max_{\mathcal{G} \subseteq [1:N]} I(U_I; Y_{\mathcal{G}_1}) \quad \text{[Equation 35]}$$

$$\mathcal{G}_2^{opt} = \arg\max_{\mathcal{G}_2 \subseteq [1:N] \setminus \mathcal{G}_1^{opt}} I(U_I; Y_{\mathcal{G}_2 \cup \mathcal{G}_1^{opt}})$$

$$\mathcal{G}_3^{opt} = \arg\max_{\mathcal{G}_3 \subseteq [1:N] \setminus (\mathcal{G}_1^{opt} \cup \mathcal{G}_2^{opt})} I(U_I; Y_{\mathcal{G}_3 \cup \mathcal{G}_1^{opt} \cup \mathcal{G}_2^{opt}})$$

$$\vdots$$

$$\mathcal{G}_J^{opt} = \arg\max_{\mathcal{G}_J \subseteq [1:N] \setminus (\bigcup_{j=1}^{J-1} \mathcal{G}_j^{opt})} I(U_I; Y_{\mathcal{G}_J \cup \bigcup_{j=1}^{J-1} \mathcal{G}_j^{opt}})$$

Herein, mutual information $I(U_I; Y_B)$ is calculated as follows.

$$I(U_I; Y_B) = \sum_{i \in I} I(U_i; \mathcal{L}_i(B)) \quad \text{[Equation 36]}$$

In particular, as described above, $I(U_i; L_i(B))$ is calculated as follows.

$$I(U_i; \mathcal{L}_i(B)) = \mathbb{E}[I_{h_b}(U_i; \mathcal{L}_i(B))] \quad \text{[Equation 37]}$$

$$= \mathbb{E}\left[\log_2\left(\frac{2}{1+e^{-\mathcal{L}_i(B)}}\right)\bigg| U_i = 0\right],$$

$$i \in B$$

$$= \int_{-\infty}^{\infty} p(\mu_i) \int_{-\infty}^{\infty} \frac{1}{\sqrt{2\pi\sigma_i^2}} e^{-\frac{(x-\mu_i)^2}{2\sigma_i^2}}$$

$$\log_2\left(\frac{2}{1+e^{-x}}\right) dx d\mu_i$$

In order to determine the set $\mathcal{G}_1$ for the initial transmission, the following properties may be mathematically proved.

$$I(U_I;Y_I) = \max_{\mathcal{G}\in[1:N], |\mathcal{G}|=K} I(U_I;Y_\mathcal{G})$$ [Equation 38]

Therefore, $\mathcal{G}_1$ is allowed to include all information bits in a set $I$ as follows.

$$\mathcal{G}_1 \supseteq I$$ [Equation 39]

A calculation amount required to optimize all sets $\mathcal{G}_j$ in this manner is as follows.

$$\binom{N}{M_1} + \binom{N-M_1}{M_2} + \binom{N-M_1-M_2}{M_3} + \ldots + \binom{M_J}{M_J}$$ [Equation 40]

In order to decrease the calculation amount, a method proposed above in sub-optimization of a polar code having a random length may be used. That is, a minimum increment $\Delta N$ of a code length may be defined, and a code may be optimized such that $\Delta N$ corresponds to a resolution. In this case, a total calculation amount is as follows.

$$\binom{\frac{N}{\Delta N}}{\frac{M_1}{\Delta N}} + \binom{\frac{N-M_1}{\Delta N}}{\frac{M_2}{\Delta N}} + \binom{\frac{N-M_1-M_2}{\Delta N}}{\frac{M_3}{\Delta N}} + \ldots + \binom{\frac{M_J}{\Delta N}}{\frac{M_J}{\Delta N}}$$ [Equation 41]

3.2 Simplified HARQ Scheme 1

Now, a simplified HARQ scheme based on grouping is described. Such a scheme is simpler than the aforementioned HARQ scheme 1.

In polar coding, mutual information $I(W_N^{(i)})$ of an $i^{th}$ bit channel $W_N^{(i)}$ is as follows.

$$I(W_N^{(i)}) = I(U_i; Y_1^N, U_1^{i-1}), i=1, \ldots, N$$ [Equation 42]

To decrease a calculation amount of puncturing, a method is used in which bits are selected sequentially one by one in order of significance among $N$ bit channels. That is, a method is used in which one bit channel output $Y_j$ is selected as follows, in order of significance among outputs $Y_1^N$ of all $N$ bit channels.

$$Y_1^N \to Y_j$$ [Equation 43]

To decode an $i^{th}$ input bit $U_i$, polar coding uses all output bits $Y_1^N$ and previously decoded all input bits $U_1^{i-1}$. However, there may be errors in input bits which are previously decoded in a real environment. To solve such a problem, a new bit grouping algorithm is proposed as follows.
(Step 1)

It is assumed that indices $i_1, i_2, \ldots, i_N$ express an index of a bit channel when the bit channel is aligned in such a manner that mutual information is decreased as follows.

$$I(U_{i_N}; Y_{i_1}^N, U_{i_1}^{i_N-1}) \geq I(U_{i_{N-1}}; Y_{i_1}^N, U_{i_1}^{i_N-2}) \geq \ldots \geq I(U_{i_2}; Y_{i_1}^N, U_{i_1}) \geq I(U_{i_1}; Y_{i_1}^N)$$ [Equation 44]

The Equation 44 above is simply expressed as follows.

$$I(W_N^{(i_N)}) \geq I(W_N^{(i_{N-1})}) \geq \ldots I(W_N^{(i_2)}) \geq I(W_N^{(i_1)})$$ [Equation 45]

(Step 2)

The most significant input bits are sequentially selected one by one on the basis of mutual information, and the selected input bit and one output bit having the greatest mutual information are determined. Such a selection method may be mathematically obtained as follows.

$U_{i_N}$ is an input bit which generates the greatest mutual information $I(W_N^{(i_j)})$ among all input bits. When an output bit having the greatest mutual information with respect to the input bit $U_{i_N}$ is expressed by $Y_{j_N}$, an index $j_N$ of an output bit $Y_{j_N}$ is as follows.

$$\tilde{j}_N = \arg\max_{j\in\{1,2,\ldots,N\}} I(U_{i_N}; Y_j, \hat{U}_{i_1}^{i_N-1})$$ [Equation 46]

Herein, $\hat{U}_{i_1}^{i_N-1}$ denotes decoded values of previous input bits $U_{i_1}^{i_N-1}$ when an output $Y_j$ is given.

Next, is an input bit which generates the second greatest mutual information. When an output bit having the greatest mutual information with respect to the input bit $U_{i_{N-1}}$ is expressed by $Y_{j_{N-1}}$, an index $j_{N-1}$ of an output bit $Y_{j_{N-1}}$ is as follows.

$$\tilde{j}_{N-1} = \arg\max_{j\in\{1,2,\ldots,N\}/\tilde{j}_N} I(U_{i_{N-1}}; Y_j, Y_{\tilde{j}_N}, \hat{U}_{i_1}^{i_N-2})$$ [Equation 47]

Herein, $\hat{U}_{i_1}^{i_N-2}$ denotes decoded values of previous input bits $U_{i_1}^{i_N-2}$ when an output $Y_j$ and an output $Y_{\tilde{j}_N}$ optimally selected previously are given.

In the aforementioned manner, the most significant input bits are selected sequentially one by one on the basis of mutual information, and the selected input bit and one output bit having the greatest mutual information are determined. This is generalized by the following equation.

$$\tilde{j}_k = \arg\max_{j\in\{1,2,\ldots,N\}/\{\tilde{j}_N,\ldots,\tilde{j}_{k+1}\}} I(U_{i_k}; Y_j, Y_{\tilde{j}_{k+1}}^{\tilde{j}_N}, \hat{U}_{i_1}^{i_k-1}),$$

$$k = 1, 2, \ldots, N$$ [Equation 48]

Herein, $\hat{U}_{i_1}^{i_k-1}$ denotes decoded values of previous input bits $U_{i_1}^{i_k-1}$ when an output $Y_j$ and an output $Y_{\tilde{j}_{k+1}}^{\tilde{j}_N}$ optimally selected previously are given.

Therefore, a selection scheme for optimization may be mathematically obtained, and a result thereof is as follows.

$$\tilde{j}_k = i_k, k=1, 3, \ldots, N$$ [Equation 49]

Such a result means that an output bit which generates the greatest mutual information with respect to each input bit has the same index. In this case, it is assumed that a matrix of generating a polar code is given by. Herein, it is a 2×2 matrix given by $F_2=[1\ 1; 1\ -1]$. By using such a mathematical result, optimal index sets may be mathematically expressed as follows.

[Simplified Bit Grouping Algorithm for HARQ Scheme 1]

Figure 6:
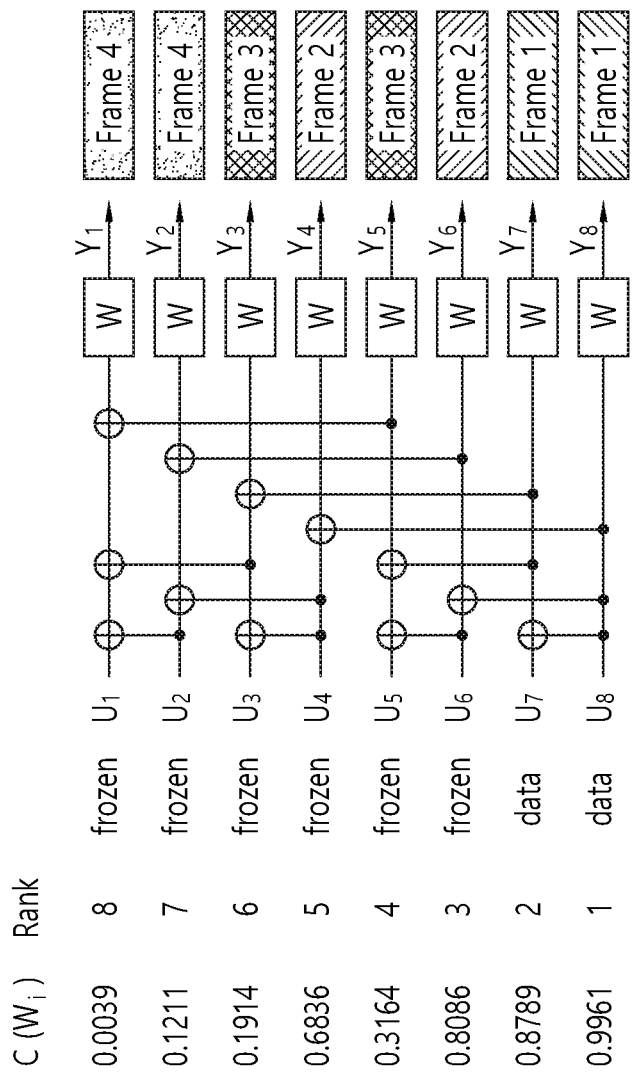
FIG. 6 shows an example of a simplified bit grouping algorithm for an HARQ scheme 1.
Figure 7:
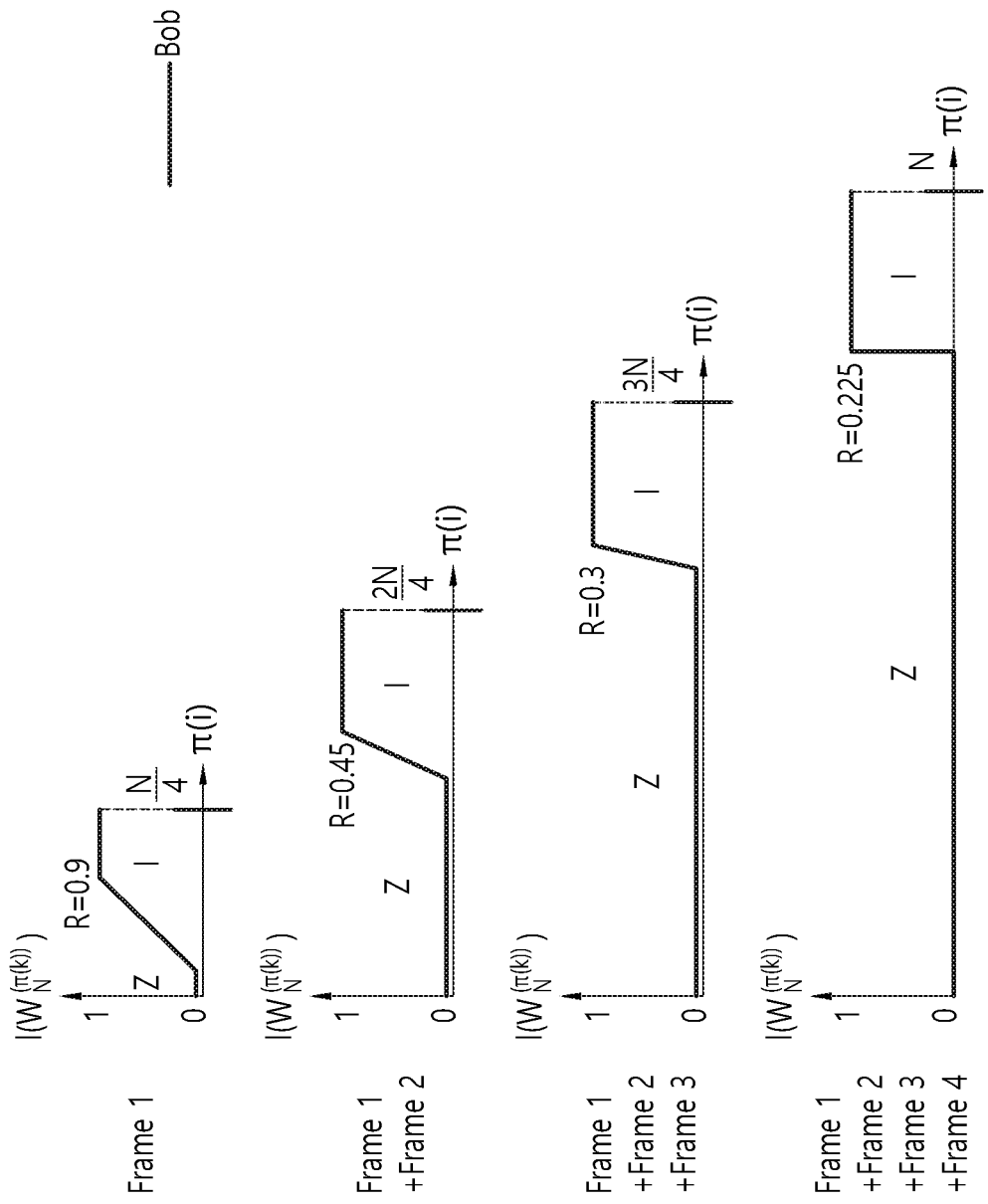
FIG. 7 is a conceptual diagram for explaining concept of a simplified bit grouping algorithm for an HARQ scheme 1.

FIG. 6 shows an example of a simplified bit grouping algorithm for an HARQ scheme 1. In addition, FIG. 7 is a conceptual diagram for explaining concept of a simplified bit grouping algorithm for an HARQ scheme 1.

$$\mathcal{G}_1 = [\underbrace{i_{N-M_1+1}, i_{N-M_1+2}, \ldots, i_{N-K}}_{for\ (M_1-K)\ zeros},$$

$$\underbrace{i_{N-K+1}, i_{N-K+2}, \ldots, i_N}_{for\ K\ info\ bits}]$$ [Equation 50]

$$\mathcal{G}_2 = \underbrace{[i_{N-M_1-M_2+1}, i_{N-M_1-M_2+2}, \ldots, i_{N-M_1}]}_{for\ M_2\ zeros}$$

-continued $$\mathcal{G}_3 = [\underbrace{i_{N-M_1-M_2-M_3+1}, i_{N-M_1-M_2-M_3+2}, \cdots, i_{N-M_1-M_2}}_{for\,M_3\,zeros}]$$

$$\vdots$$

$$\mathcal{G}_J = [\underbrace{i_1, i_2, \cdots, i_{N-\sum_{j=1}^{J}M_j}}_{for\,M_J\,zeros}]$$

The simplified bit grouping algorithm and its concept for the HARQ scheme 1 according to Equation 50 are as shown in FIG. 6 and FIG. 7.

Although the locations of the information bit and the frozen bit are determined based on the aforementioned mutual information or ranking of the mutual information in the HARQ schemes proposed in the present specification, it is apparent that the HARQ scheme are also applicable to a case where the locations of the information bit and the frozen bit are determined based on any other criteria.

3.3 HARQ Scheme 2

In the HARQ scheme 1 described above, the first step is to construct an optimal mother code having a length N and having K information bits. Therefore, a location of the information bit is optimized based on a first constructed mother code. However, the location of the information bit is not optimized in terms of a first packet $\mathcal{G}_1$. More generally, the location of the information bit may be optimized only when all of J packets $\mathcal{G}_j$, j=1, 2, . . . , J are transmitted.

To solve this problem, the HARQ scheme 2 considers an approach opposite to the HARQ scheme 1. In the HARQ scheme 2, the information bit is optimized based on a first packet (or a coded bit group). If transmission of the first packet is not successful, additional packets are transmitted. The HARQ scheme 2 may be classified into three schemes according to a scheme of transmitting an additional packet.

3.3.1 HARQ Scheme 2A

In the HARQ scheme 2A, locations of information bits of a polar code are optimized based on a first packet. That is, in the HARQ scheme 2A, packets in which a location of an information bit having a length $M_1$ is optimized are first transmitted, and all packets transmitted additionally thereafter are frozen bits (or zeros). In this case, coded bits of the additionally transmitted packet are not independent of coded bits of a previously transmitted packet, and coded packets of all packets constitute one large polar code.

Figure 8:
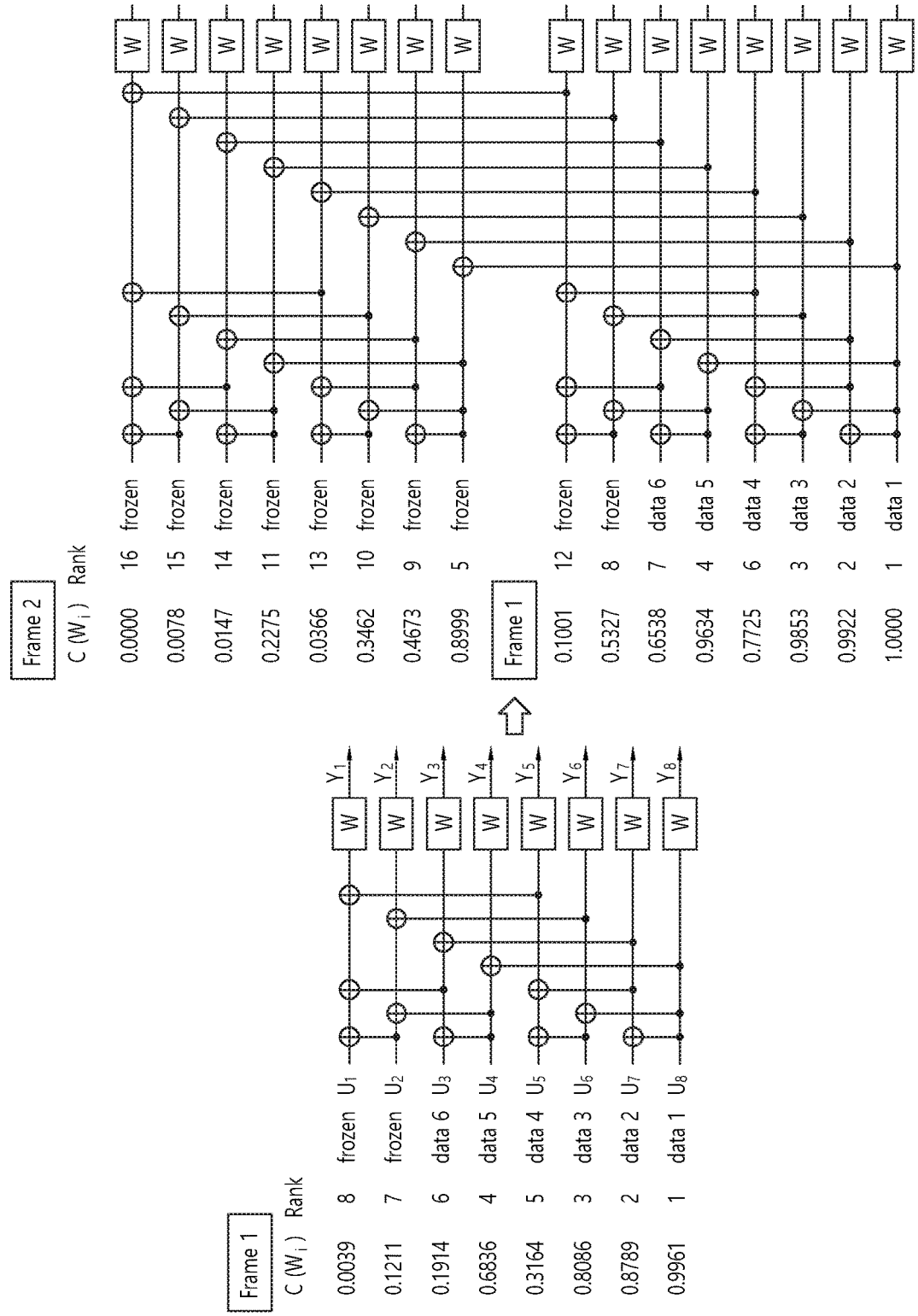
FIG. 8 shows an example of transmission based on an HARQ scheme 2A.

FIG. 8 shows an example of transmission based on the HARQ scheme 2A.

As shown in FIG. 8, a location of an information bit in a first packet is optimized based on the first packet given in a current state. After the first packet is transmitted, if a receiver fails to properly decode the packet, a transmitting end additionally transmits a second packet. In this case, input bits of the second packet are all frozen bits, but output bits of the second bit depend on input bits of the first packet. That is, as shown in FIG. 8, one large polar code (having a length of 16 in FIG. 8) is constructed in which the first packet and the second packet are combined. In addition, decoding is performed again in a receiving end by using all received bits.

3.3.2 HARQ Scheme 2B

In the HARQ scheme 2B, similarly to the HARQ method 2A, locations of information bits of a polar code are optimized based on a first packet. However, the HARQ scheme 2B differs from the HARQ scheme 2A in that an additionally transmitted packet transmits specific information bits together in addition to a frozen bit. The information bits transmitted through the additionally transmitted packet are information bits transmitted through a bit channel having low mutual information among information bits transmitted through the existing packet. That is, the information bits transmitted through the additionally transmitted packet are a type of repetition coding.

Figure 9:
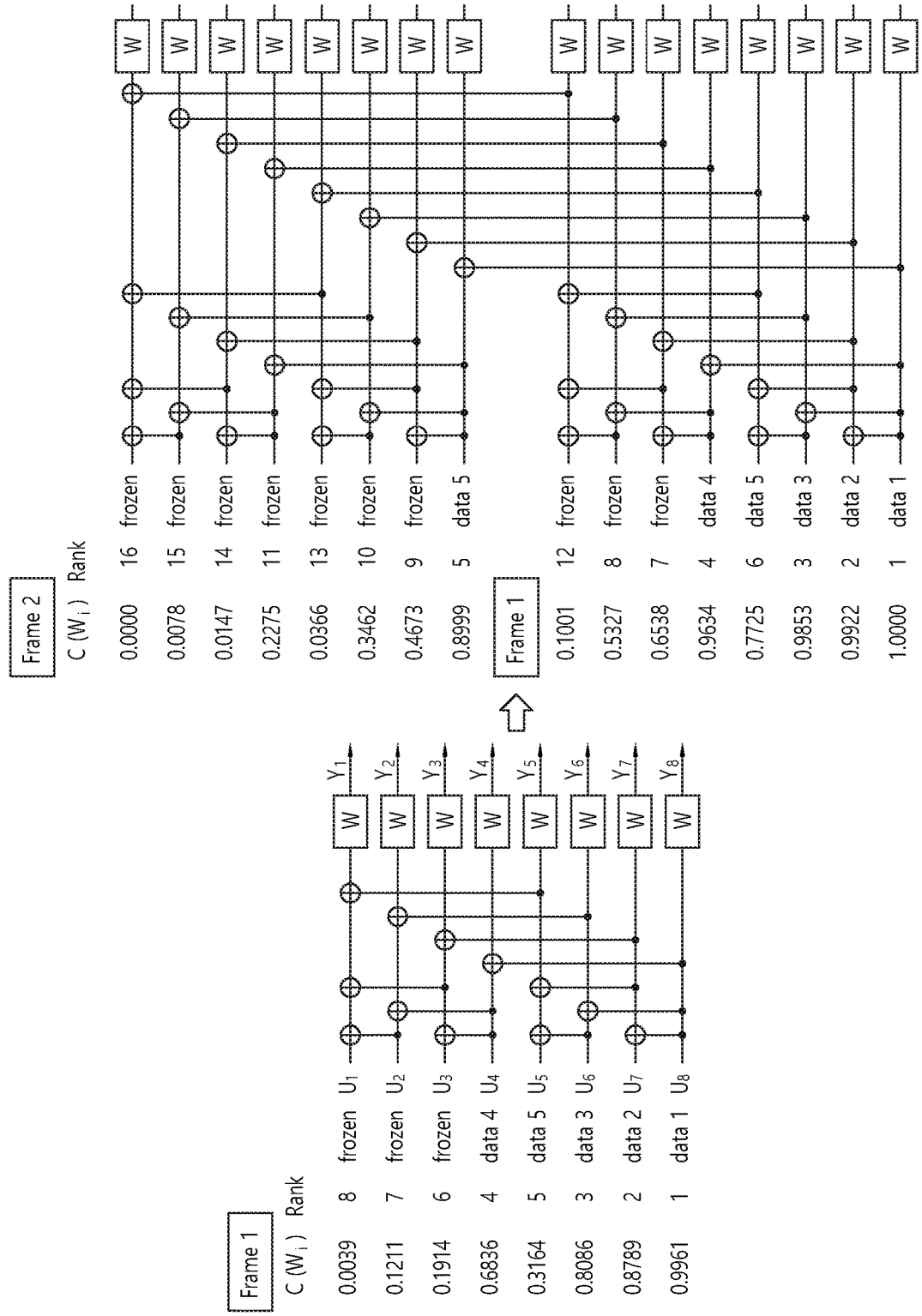
FIG. 9 shows an example of transmission based on an HARQ scheme 2B.

FIG. 9 shows an example of transmission based on the HARQ scheme 2B.

As shown in FIG. 9, a location of an information bit of a first packet is the same as that of the HARQ scheme 2A. When a second packet is constructed after transmitting the first packet, one information bit (data 5) is transmitted together with a frozen bit in the HARQ scheme 2B.

The reason for retransmitting the data 5 among 5 information bits transmitted through the first packet is as follows. First, five input information bits in the first packet are transmitted on bit channels each having a different mutual information. Data 1 is transmitted through a bit channel having mutual information of 0.9961. Data 2 is transmitted through a bit channel having mutual information of 0.8789. Data 3 is transmitted through a bit channel having mutual information of 0.8086. Data 4 is transmitted through a bit channel having mutual information of 0.6836. Data 5 is transmitted through mutual information of 0.3164. When a polar code having a length of 16 is constructed to transmit the second packet, mutual information of bit channels on which 5 information bits are transmitted is improved. The mutual information is improved to each of bit channels in which the mutual information of data 1 is 1.0000, the mutual information of data 2 is 0.9922, the mutual information of data 3 is 0.9853, the mutual information of data 4 is 0.9634, and the mutual information of data 5 is 0.7725. That is, in all five bit channels, the mutual information is more improved than a case where only the first packet is transmitted alone.

On the basis of mutual information of a second packet portion, mutual information of 8 bit channels in a packet is small in general in comparison with the first packet. However, there may be exceptions. For example, as shown in FIG. 9, mutual information of an $8^{th}$ bit channel of the second packet is 0.8999, which is greater than mutual information of 0.7725 for a bit channel on which data 5 is transmitted in the first packet. Basic concept of polar coding is to transmit information bits through bit channels with highest mutual information.

Therefore, a frozen bit of the HARQ scheme 2A is transmitted through the $8^{th}$ bit channel of the second packet, which is not effective. In order to solve such a problem, in the HARQ scheme 2B, data 5 transmitted on a bit channel having lower mutual information among information bits transmitted in the first packet is retransmitted through the $8^{th}$ bit channel of the second packet. That is, in comparison with the mutual information of bit channels for transmitting information bits in the first packet, if there is a bit channel having mutual information with a higher priority in the second packet, the information bit may be repeatedly transmitted through the bit channel 3.3.3 HARQ Scheme 2C The HARQ scheme 2C is the same as the HARQ scheme 2A and the HARQ scheme 2B in a sense that locations of information bits of a polar code are optimized based on a first packet. However, the HARQ scheme 2C differs from the HARQ scheme 2B in that new information bits are transmitted through a bit channel with high mutual information among bit channels belonging to an additionally transmitted packet.

Figure 10:
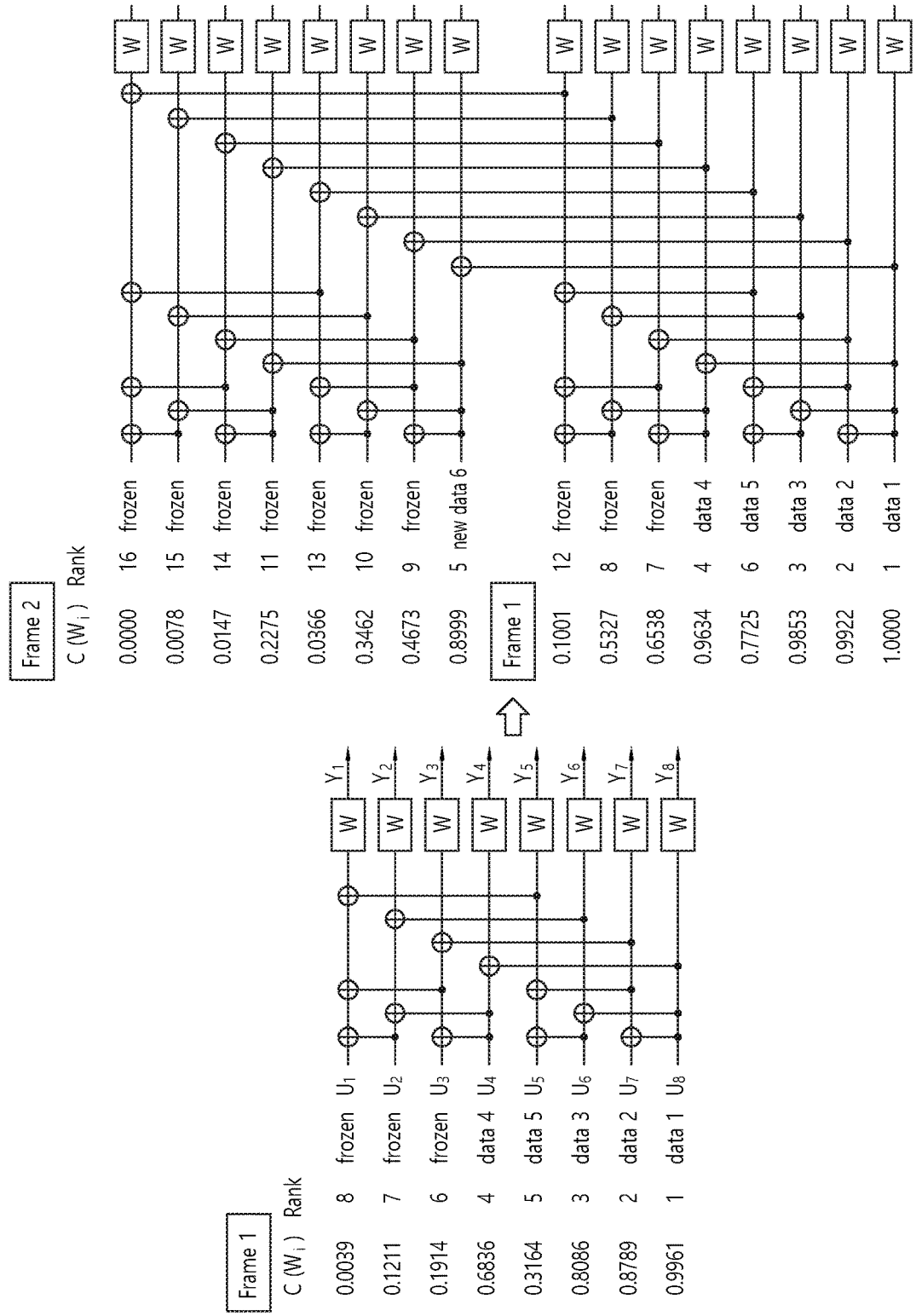
FIG. 10 shows an example of transmission according to an HARQ scheme 2C.

FIG. 10 shows an example of transmission according to the HARQ scheme 2C.

As shown in FIG. 10, mutual information of an $8^{th}$ bit channel of a second packet is higher than mutual information of a bit channel on which data 5 of a first packet is transmitted. Therefore, it is more efficient to transmit an information bit than to transmit a frozen bit through the 8-bit channel of the second packet. In the HARQ scheme 2B, a previous information bit is retransmitted through the $8^{th}$ bit channel of the second packet. However, in the HARQ scheme 2C, a new information bit, i.e., data 6, is transmitted through the $8^{th}$ bit channel of the second packet. That is, in comparison with the mutual information of bit channels for transmitting information bits in the first packet, if there is a bit channel having mutual information with a higher priority in the second packet, the information bit may be repeatedly transmitted through the bit channel.

Figure 11:
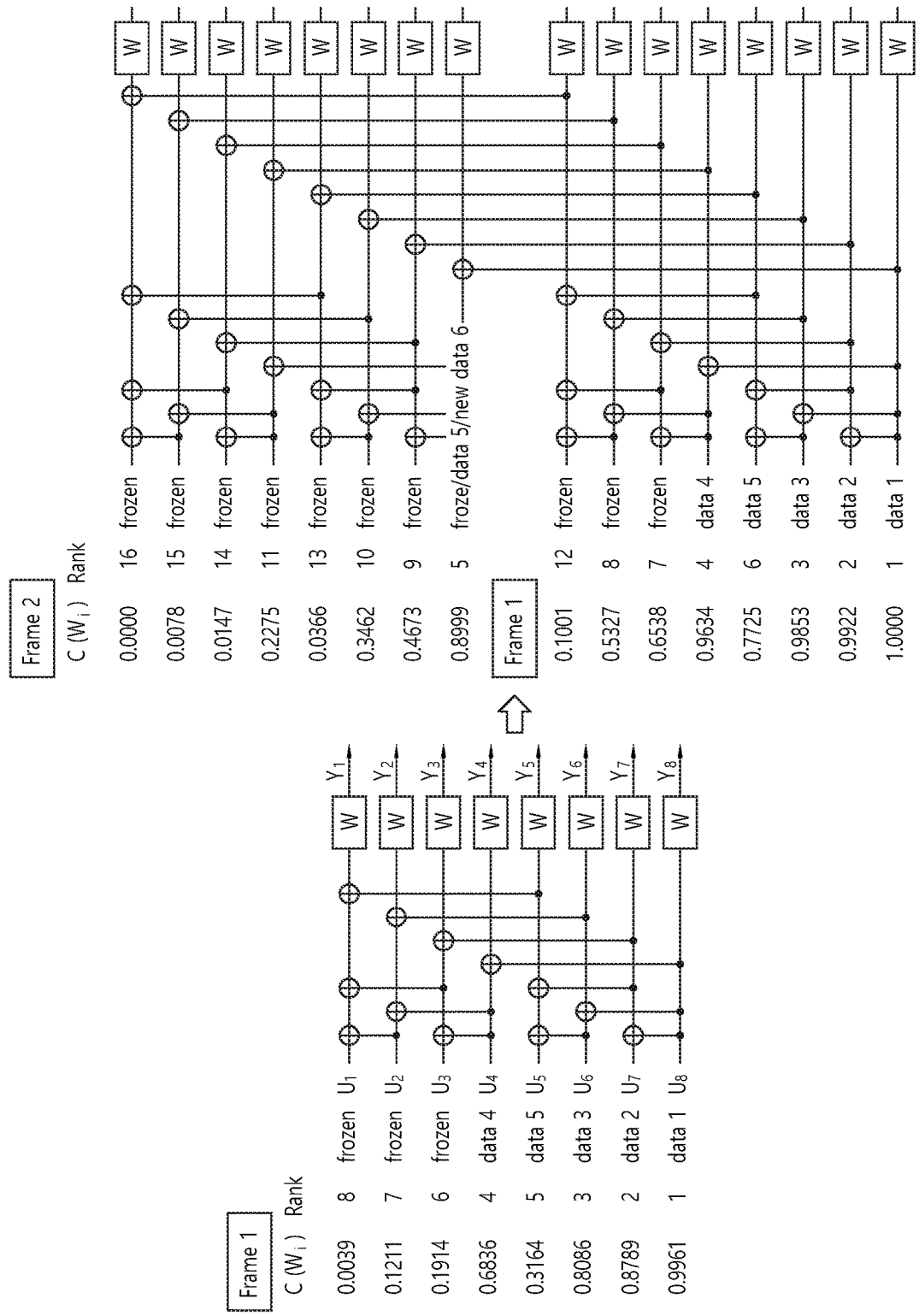
FIG. 11 shows an example of comparing an HARQ scheme 2A, an HARQ scheme 2B, and an HARQ scheme 2C.

FIG. 11 shows an example of comparing the HARQ scheme 2A, the HARQ scheme 2B, and the HARQ scheme 2C.

As shown in FIG. 11, an $8^{th}$ bit of a second packet is used to transmit a frozen bit in the HARQ scheme 2A, to transmit a previous information bit in the HARQ scheme 2B, and to transmit a new information bit in the HARQ scheme 2C.

3.3.4 Combination of the HARQ Scheme 1 and the HARQ Scheme 2

A scheme may be considered in which the HARQ scheme 1 and the HARQ scheme 2 are combined complexly. First, advantages and disadvantages of the HARQ scheme 1 and the HARQ scheme 2 are compared.

Since an information bit is optimized based on a mother code in the HARQ scheme 1, a location of the information bit may be significantly different from an optimal location when only an initial packet is transmitted. Therefore, although a significantly large mother code is constructed and thus many packets are generated, performance deterioration may occur when only the initial packets are transmitted.

On the other hand, an information bit is optimized based on a first packet in the HARQ scheme 2. However, when many packet are additionally transmitted after the first packet, locations of the information bits may be significantly different from an optimal location, which may lead to performance deterioration.

Figure 12:
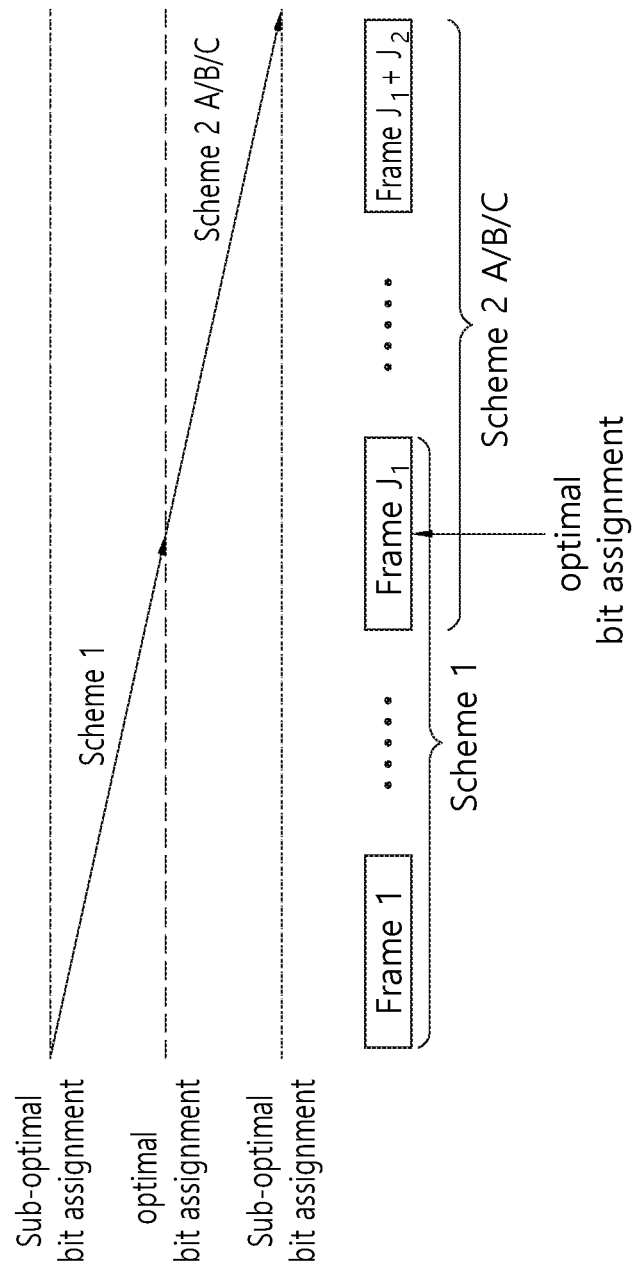
FIG. 12 shows an example of a scheme in which an HARQ scheme 1 and an HARQ scheme 2 are combined.

FIG. 12 shows an example of a scheme in which the HARQ scheme 1 and the HARQ scheme 2 are combined.

As shown in FIG. 12, the scheme in which the HARQ scheme 1 and the HARQ scheme 2 are combined are initially performed based on the HARQ scheme 1, but is performed based on the HARQ scheme 2 after all coded bits of a mother code are transmitted. In this case, an information bit is optimally configured neither when a first packet is transmitted nor after all packets are transmitted. That is, in the HARQ scheme 1, the information bit is optimally configured when a last packet is transmitted, and in the HARQ scheme 2, the information bit is optimally configured when a first packet is transmitted. However, the scheme in which the HARQ scheme 1 and the HARQ scheme 2 are combined may variably coordinate a location of a packet in which the information bit is optimally configured. The optimal packet location may be determined by considering several conditions such as a channel environment or the like.

When it is said that the HARQ scheme 1 is used first, followed by switching to the HARQ scheme 2, it is a description in terms of a generator matrix of a polar code, not in terms of a location of an information bit. When switching from the HARQ scheme 1 to the HARQ scheme 2, the location of the information bit is not changed.

Figure 13:
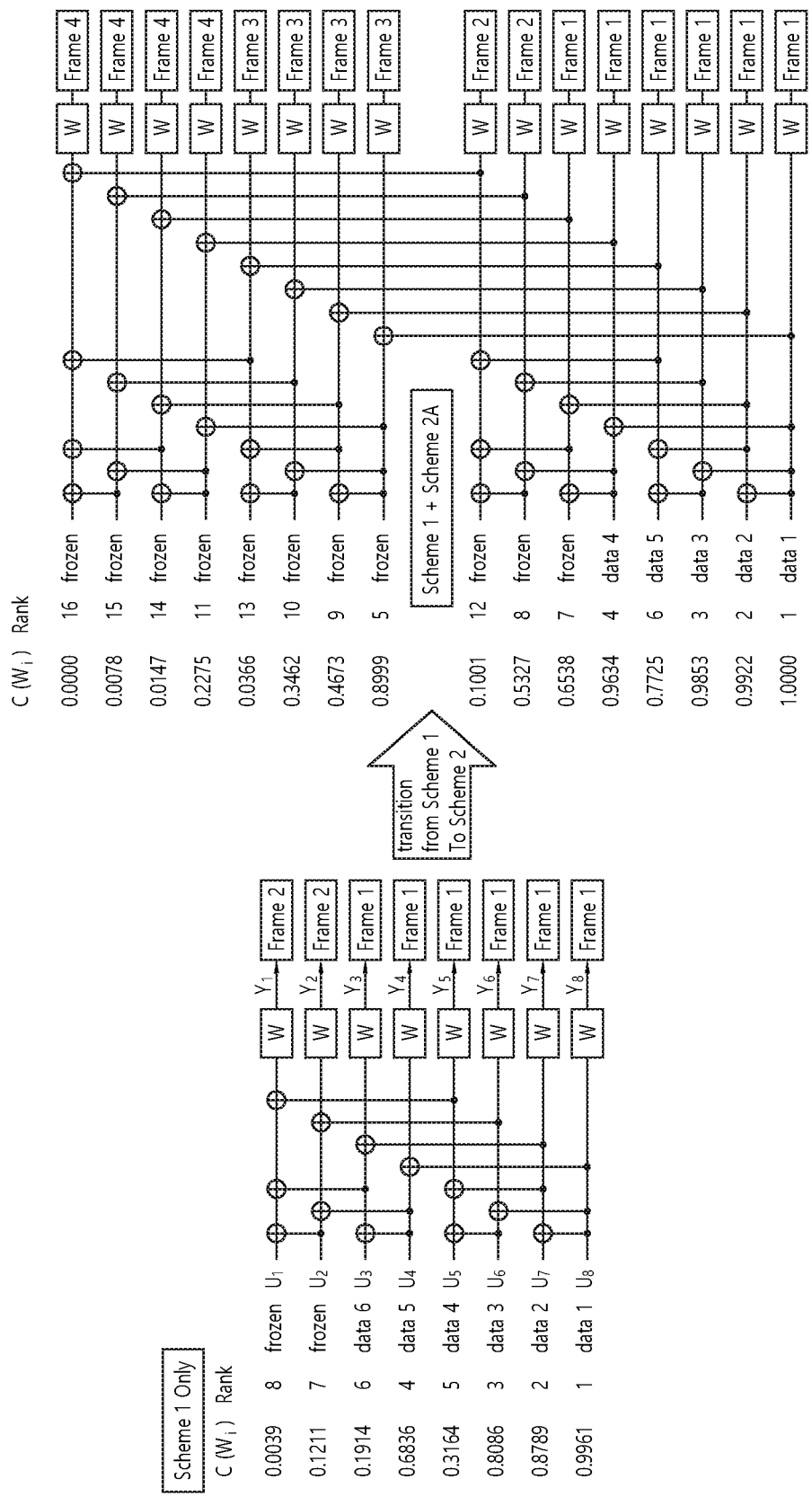
FIG. 13 shows another example of a scheme in which an HARQ scheme 1 and an HARQ scheme are combined.

FIG. 13 shows another example of a scheme in which the HARQ scheme 1 and the HARQ scheme are combined.

As shown in FIG. 13, an operation is first performed based on the HARQ scheme 1. Specifically, a mother code having a length of 8 is generated based on the HARQ scheme 1, and a location of an information bit is configured in the generated mother code in an optimal manner. Last 5 bits are configured in the example of FIG. 13. The mother code in which the location of the information bit is configured is punctured to generate a first frame having a length of 6 and a second frame having a length of 2. In addition, two generated frames (or packets) are sequentially transmitted. When all of the two frames are transmitted, an operation is performed based on the HARQ scheme 2. As such, when switching to the HARQ scheme 2, the location of the information bit is not changed. Since the information bit has already been transmitted previously, it cannot be changed and should not be changed. As shown in FIG. 13, last 5 bits (last 4 bits and a $9^{th}$ bit from the end, on the basis of a polar code having a length of 16) is still the information bit. After switching to the HARQ scheme 2, frozen bits are transmitted in a state where a location of the existing information bit is fixed.

3.3.5 Improved HARQ Scheme 2

Another problem of the HARQ scheme 2 is that a generator matrix of a polar code may be different from an optimal polar code generator matrix over time. Herein, the generator matrix of the optimal polar code exists when a code length is $2^n$, and may imply a generator matrix of an original polar code. More specifically, in the HARQ scheme 2, the more the packets are transmitted, the longer the polar code are constructed in a receiving end. In this case, a polar code to be constructed later must include a generator matrix of a previously constructed polar code. Herein, if no condition is given, a generator matrix of a polar code constructed later may be different from a generator matrix of an optimal polar code. In order to solve such a problem, packets are additionally transmitted based on HARQ so that a polar code to be constructed is an optimal polar code whenever a length of a polar code to be constructed in a receiving end is $2^n$, n=1, 2, 3, . . . .

Herein, optimization implies not optimization of the location of the information bit but optimization of the generator matrix of the polar code. For example, the HARQ scheme 2 for the optimal generator matrix may be configured as follows. First, an optimal generator matrix corresponding to a length $2^3=8$ and an optimal generator matrix corresponding to a length $2^4=16$ are configured. Thereafter, a generator matrix having a length $M_1$ and a length $M_2$ are constructed. Herein, $8<M_1<M_2<16$.

In this case, when constructing the generator matrix having the length $M_1$ and the length $M_2$, the following conditions shall be satisfied.

1) The generator matrix having the length $M_1$ shall include a generator matrix having a length of 8, and the generator matrix having the length $M_1$ shall be included in the generator matrix having the length $M_2$.

2) The generator matrix having the length $M_2$ shall include the generator matrix having the length $M_1$, and shall be included in the generator matrix of the length of 16.

Transmission is achieved in practice as follows.

First, a polar code having a length of 8 is transmitted. Next, in the polar code having the length $M_1$, the remaining parts except for a generator matrix of a part corresponding to a previously transmitted polar code of a length of 8 are transmitted. Next, in the polar code having the length $M_2$, the remaining parts except for a generator matrix of a part corresponding to the previously transmitted polar code of the length $M_1$ are transmitted. Finally, in the polar code having a length of 16, the remaining parts except for a generator matrix of a part corresponding to the polar code having the length $M_2$ are transmitted.

3.4 HARQ Scheme 3

A new HARQ scheme different from the aforementioned HARQ scheme 1 and HARQ scheme 2 is considered. The HARQ scheme 3 is the same as the HARQ scheme 1 in a sense that a mother code is generated and the generated mother code is punctured. However, in the HARQ scheme 1, the mother code is generated, and puncturing is performed after locations of an information bit and a frozen bit are optimized. On the other hand, in the HARQ scheme 3, the locations of the information bit and the frozen bit are optimized after the mother code is generated and puncturing is performed.

For example, after a mother code with a transfer rate of ⅓ is constructed, if it is assumed that a reference transfer rate for HARQ transmission is ½, the HARQ scheme 3 preferentially generates a code with a transfer rate of ½ by puncturing the mother code, and thereafter optimizes the locations of the information bit and the frozen bit. In this case, the reference transfer rate (e.g., ½ or ⅓) for HARQ transmission may be configured by a previously received indication signal, or may be predetermined.

According to the aforementioned HARQ scheme 3, the location of the information bit and the location of the frozen bit are not optimized for every puncturing, but are optimized by assuming a case where a mother code is punctured based on a specific pattern with a coding rate. By directly applying the determined locations of the information bit and frozen bit, transmission is achieved in such a manner that, for each HARQ packet transmission, a part of the mother code is punctured or the mother code is repeated.

4. Secure HARQ Based on Polar Coding

A scheme is described in which the aforementioned polar coding based HARQ schemes is extendedly applied to physical layer security communication. Data transmitted by Alice (i.e., a transmitter) must be decoded without error by Bob (i.e., a receiver), and must not be decoded by Eve (i.e., an eavesdropper). For this, mutual information of a channel between Alice and Bob must be kept very close to 1, and mutual information of a channel between Alice and Eve must be kept very close to 0.

The following description assumes that channel capacity for Bob and channel capacity for Eve are not known to Alice. If the channel capacity for Bob and the channel capacity for Eve are known to Alice, a polar code may be constructed based on the existing method and there is no need to use a secure HARQ scheme. Instead, it is assumed that Alice knows that the channel capacity for Bob is at least greater than $C^b_{min}$, and Alice knows that the channel capacity for Eve is at best less than $C^e_{max}$. In a real environment, the values $C^b_{min}$ and $C^e_{max}$ may be conservatively estimated.

A polar code of which a code length is N and the number of information bits is K is constructed as a mother code. It is assumed that Z denotes a set of frozen bits, I denotes a set of information bits, and R denotes a set of random bits. In addition, it is assumed that bit channel indices $i_1, i_2, \ldots, i_N$ respectively denote indices of bit channels which are sorted in a descending order of mutual information of a bit channel.

$$I(W_N^{(i_N)}) \geq I(W_N^{(i_{N-1})}) \geq \ldots I(W_N^{(i_2)}) \geq I(W_N^{(i_1)}) \quad \text{[Equation 50]}$$

In this case, sets I, Z, and R are as follows.

$$\mathcal{Z} = \{i_k : i_1 \leq i_k \leq i_b\} = \{i_1, i_2, \ldots, i_b\}$$

$$\mathcal{I} = \{i_k : i_b < i_k < i_e\} = \{i_{b+1}, i_{b+2}, \ldots, i_{e-1}\}$$

$$\mathcal{R} = \{i_k : i_e \leq i_k \leq i_N\} = \{i_e, i_{e+1}, \ldots, i_N\} \quad \text{[Equation 51]}$$

Herein, $i_b$ representing a boundary between Z and I and $i_e$ representing a boundary between I and R may be determined as follows.

$$i_b = \max_{i \in [i_1 : i_N]} i \text{ subject to} \quad \text{[Equation 52]}$$

$$I(U_i; \mathcal{L}_i^b([1:N]) \mid C^b_{min}) \leq \delta^b_{Th}$$

$$i_e = \max_{i \in [i_1 : i_N]} i \text{ subject to}$$

$$I(U_i; \mathcal{L}_i^e([1:N]) \mid C^e_{max}) \geq \delta^e_{Th}$$

Herein, $L_i([1:N])$ denotes an LLR value for an $i^{th}$ bit channel of a mother code having a length N. In order for Bob to decode data without error, it must be determined as $\delta^b_{Th} \simeq 1$. In order for Eve not to decode data, it must be determined as $\delta^e_{Th} \simeq 0$.

Figure 14:
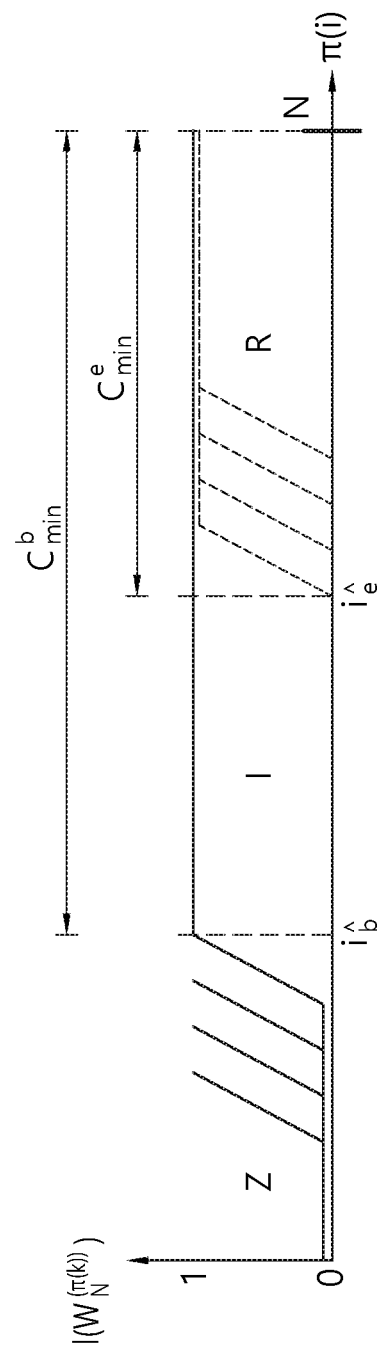
FIG. 14 shows an example of values $i_b$ and $i_e$ for a mother code.

FIG. 14 shows an example of values $i_b$ and $i_e$ for a mother code.

The values $i_b$ and $i_e$ of FIG. 14 are for a polar code having a length N and used as a mother code. It is assumed that N coded bits in the mother code are divided into J groups, and each group has a magnitude $M_j$, j=1, 2, 3, . . . , J.

$$|\mathcal{G}_1| = M_1, |\mathcal{G}_2| = M_2, \ldots, |\mathcal{G}_J| = M_J \quad \text{[Equation 53]}$$

In this case, $\Sigma_{j=1}^J M_j = N$, and $\mathcal{G}_{i_1} \cap \mathcal{G}_{i_2} = \emptyset$, $1_1 \neq 1_2$.

4.1 Secure HARQ scheme 1A

For a secure HARQ scheme 1A, a non-secure HARQ scheme 1 is extendedly applied to physical layer security communication. In the secure HARQ scheme 1A, each group is configured as follows.

$$\mathcal{G}_j = \begin{cases} \mathcal{Z}_1 \cup \mathcal{I} \cup \mathcal{R}, & j = 1 \\ \mathcal{Z}_j, & j = 2, 3, \ldots, J \end{cases} \quad \text{[Equation 54]}$$

That is, a first group includes all information bits and all random bits. In addition, frozen bits belonging to $Z_1$ are also included in the first group. Except for the first group, the remaining all groups consist of only frozen bits.

For the first group, $Z_1$ may be determined optimally as follows.

$$\mathcal{Z}_1^{opt} = \arg_{\mathcal{Z}_1 \subseteq [1:N] \setminus \{\mathcal{I}, \mathcal{R}\}}^{\max} \quad \text{[Equation 55]}$$

$$\sum_{i \in \mathcal{I}} (I(U_i; \mathcal{L}_i^b(\mathcal{G}_1)) - I(U_i; \mathcal{L}_i^e(\mathcal{G}_1) \mid C^e_{max}))^+$$

subject to $I(U_i; \mathcal{L}_i^e(\mathcal{G}_1) \mid C^e_{max}) < \delta^e_{Th}, \forall i \in \mathcal{I}$ Herein, $\mathcal{L}_i(\mathcal{G}_i)$ denotes LLR of an $i^{th}$ bit channel in a polar code having a length $M_1$ and consisting of only bits in the first group.

For a second group, $Z_2$ may be determined optimally as follows.

$$\mathcal{Z}_2^{opt} = \arg_{\mathcal{Z}_2 \subseteq [1:N] \setminus \mathcal{G}_1^{opt}}^{\max} \quad \text{[Equation 56]}$$

$$\sum_{i \in \mathcal{I}} (I(U_i; \mathcal{L}_i^b(\mathcal{G}_1^{opt} \cup \mathcal{Z}_2)) - I(U_i; \mathcal{L}_i^e(\mathcal{G}_1^{opt} \cup \mathcal{Z}_2) \mid C^e_{max}))^+$$

subject to $I(U_i; \mathcal{L}_i^e(\mathcal{G}_1^{opt} \cup \mathcal{Z}_2) \mid C^e_{max}) < \delta^e_{Th}, \forall i \in \mathcal{I}$ Finally, $Z_J$ of a $J^{th}$ group may be determined optimally as follows.

$$Z_J^{opt} = \arg_{Z_J \subseteq [1:N] \setminus \bigcup_{j=1}^{J-1} G_j^{opt}} \sum_{i \in I} \left( I\left(U_i; \mathcal{L}_i^b\left(\bigcup_{j=1}^{J-1} G_j^{opt} \cup Z_J\right)\right) - \right.$$
$$\left. I\left(U_i; \mathcal{L}_i^e\left(\bigcup_{j=1}^{J-1} G_j^{opt} \cup Z_J\right) \mid C_{max}^e\right)\right)^+$$

$$\text{subject to } I\left(U_i; \mathcal{L}_i^e\left(\bigcup_{j=1}^{J-1} G_j^{opt} \cup Z_J\right) \mid C_{max}^e\right) < \delta_{th}^e,$$
$$\forall i \in I$$

[Equation 57]

Complexity required to perform the optimization varies depending on the value $M_j$, and when a code length is long, the required complexity may be significantly high. To decrease the complexity, a simplified secure HARQ scheme is described.

4.2 Simplified Secure HARQ Scheme 1A

The simplified secure HARQ scheme 1A is conceptually similar to the aforementioned simplified non-secure HARQ scheme 1. However, in the simplified secure HARQ scheme 1A, all information bits and all random bits are transmitted in a first group.

The simplified secure HARQ scheme 1A is constructed by sequentially selecting one output bit channel which provides maximum mutual information for each input bit.

Figure 15:
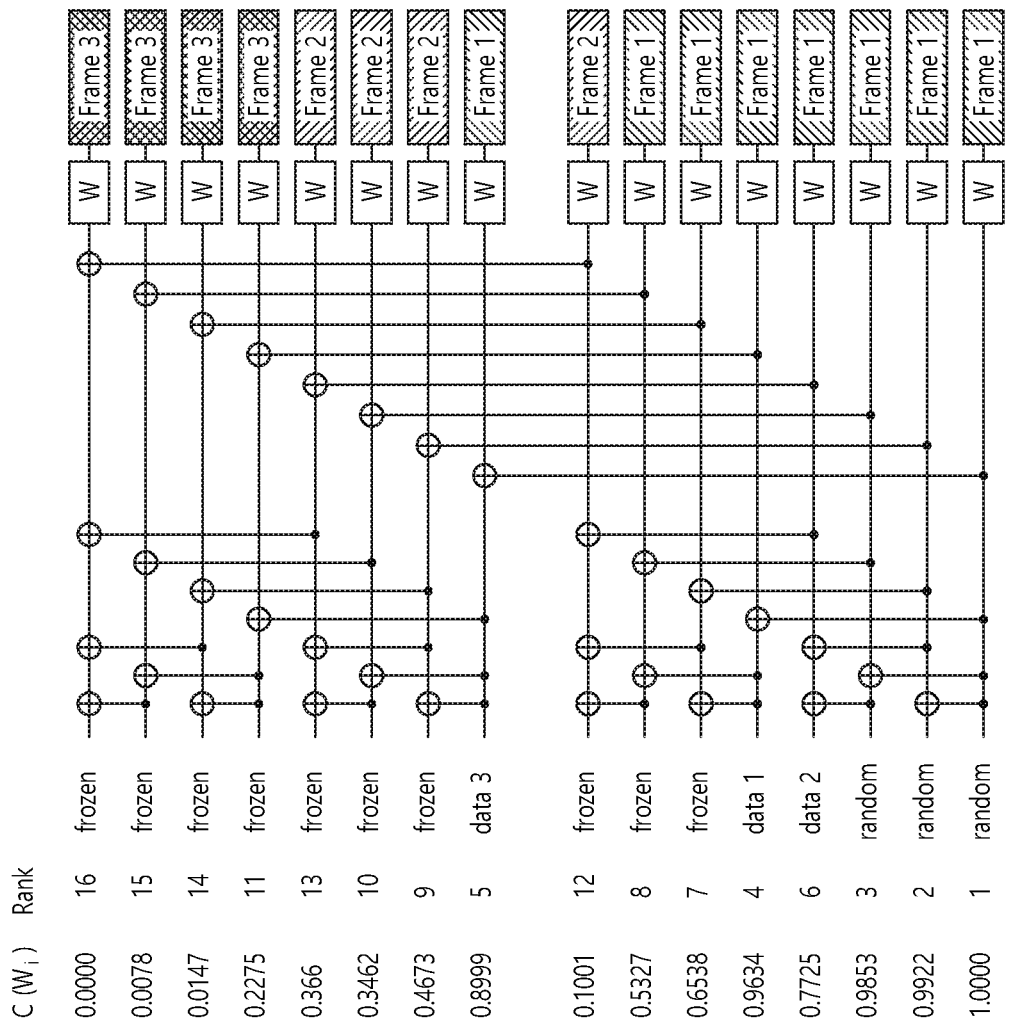
FIG. 15 shows an example of transmission according to a simplified secure HARQ scheme 1A.
Figure 16:
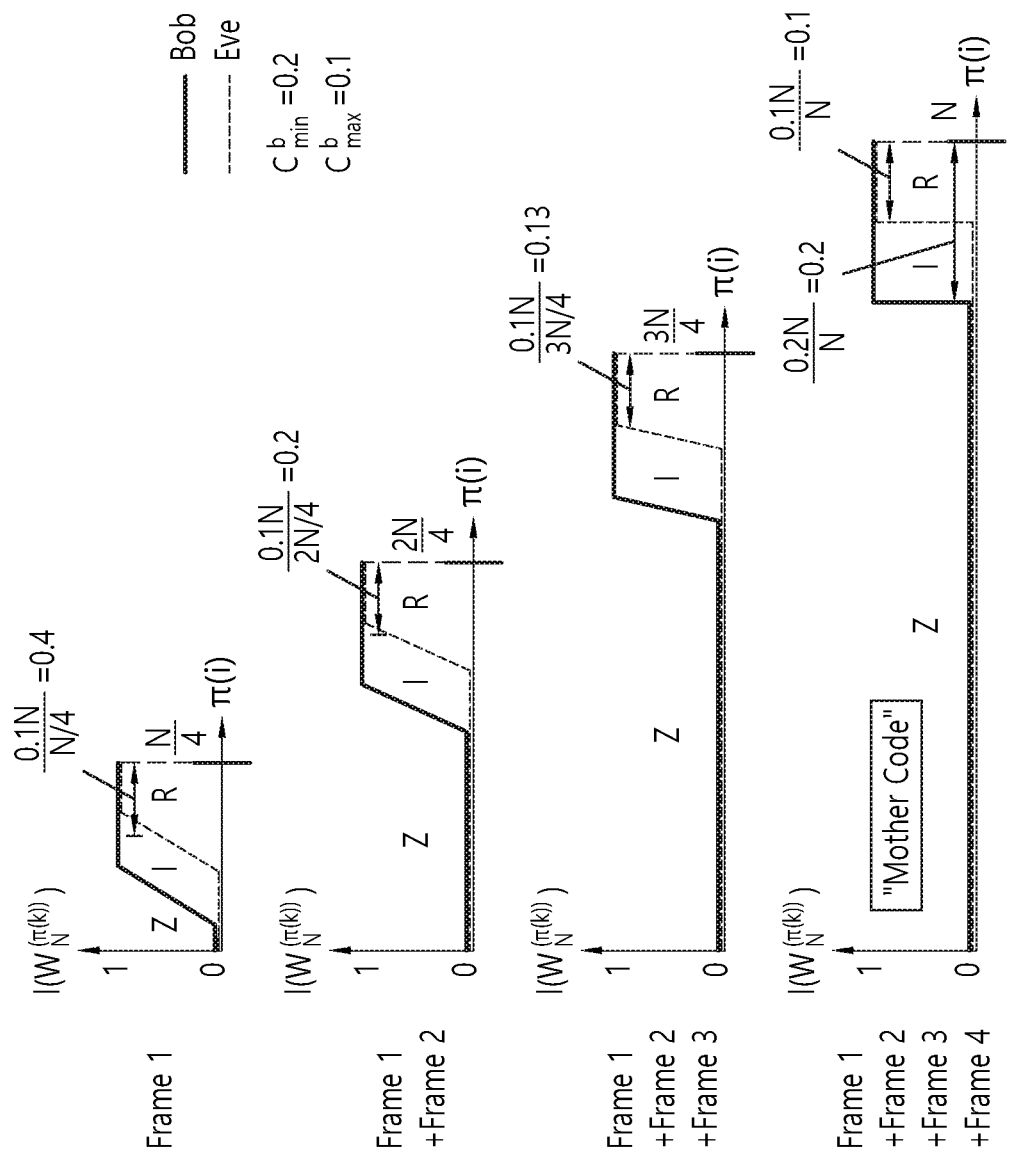
FIG. 16 is a conceptual view for explaining concept of a simplified secure HARQ scheme 1A.

FIG. 15 shows an example of transmission according to the simplified secure HARQ scheme 1A. In addition, FIG. 16 is a conceptual view for explaining concept of the simplified secure HARQ scheme 1A.

A first group may be configured as follows.

$$\mathcal{G}_1 = [\underbrace{i_{\beta_1}, i_{\beta_1}+1, \ldots, i_{\hat{b}}}_{M_1 - K - (N - \hat{e} + 1) \text{ zeros}},$$
$$\underbrace{i_{\hat{b}+1}, i_{\hat{b}+2}, \ldots, i_{\hat{e}-1}}_{K \text{ info bits}}, \underbrace{i_{\hat{e}}, i_{\hat{e}+1}, \ldots, i_N}_{\text{all } (N-\hat{e}+1) \text{ random bits}}]$$

[Equation 58]

Herein, $\beta_1 \hat{b} = (M_1 - K - N + \hat{e})$. If $K + (N - \hat{e} + 1)$ is greater than $M_1$, security communication is impossible. In this case, the value $M_1$ must be increased.

A second group may be configured as follows.

$$\mathcal{G}_2 = [\underbrace{i_{\beta_2}, i_{\beta_2+1}, \ldots, i_{\beta_1-1}}_{M_2 \text{ zeros}}]$$

[Equation 59]

Herein, $\beta_2 = \beta_1 - M_2$.

By repeating the operation, a last $J^{th}$ group may be configured as follows.

$$\mathcal{G}_J = [\underbrace{i_1, i_2, \ldots, i_{\beta_{J-1}-1}}_{M_J \text{ zeros}}]$$

[Equation 60]

An example and concept for the secure HARQ scheme 1A described according to Equations 58 to 60 are as shown in FIG. 15 and FIG. 16.

4.3 Secure HARQ Scheme 1B

In the secure HARQ scheme 1B, each bit group is given as follows.

$$\mathcal{G}_j = \begin{cases} \mathcal{Z}_1 \cup \mathcal{I} \cup \mathcal{R}_1, & j = 1 \\ \mathcal{Z}_j \cup \mathcal{R}_j, & j = 2, 3, \ldots, J \end{cases}$$

[Equation 61]

Comparing with the aforementioned secure HARQ scheme 1A, in the secure HARQ scheme 1B, random bits are not all included in a first group, but are included in each group by a minimum amount necessary for security communication.

Therefore, for the first group, $Z_1$ and $R_1$ may be determined as follows.

$$(Z_1^{opt}, \mathcal{R}_1^{opt}) = \arg \max_{Z_1, \mathcal{R}_1 \subseteq [1:N] \setminus \mathcal{I}} \sum_{i \in I}$$
$$(I(U_i; \mathcal{L}_i^b(\mathcal{G}_1)) - I(U_i; \mathcal{L}_i^e(\mathcal{G}_1) \mid C_{max}^e))^+$$
$$\text{subject to subject to } I(U_i; \mathcal{L}_i^e(\mathcal{G}_1) \mid C_{max}^e) < \delta_{Th}^e, \forall i \in I$$

[Equation 62]

For a second group, $Z_2$ and $R_2$ may be determined as follows.

$$(Z_2^{opt}, \mathcal{R}_2^{opt}) = \arg \max_{Z_2, \mathcal{R}_2 \subseteq [1:N] \setminus \mathcal{G}_1^{opt}}$$
$$\sum_{i \in I} (I(U_i; \mathcal{L}_i^b(\mathcal{G}_1^{opt} \cup \mathcal{G}_2)) - I(U_i; \mathcal{L}_i^e(\mathcal{G}_1^{opt} \cup \mathcal{G}_2) \mid C_{max}^e))^+$$
$$\text{subject to } I(U_i; \mathcal{L}_i^e(\mathcal{G}_1^{opt} \cup Z_2) \mid C_{max}^e) < \delta_{Th}^e,$$
$$\forall i \in I$$

[Equation 63]

Finally, $Z_J$ and $R_J$ of the $J^{th}$ group may be determined as follows.

$$(Z_J^{opt}, \mathcal{R}_J^{opt}) = \arg \max_{Z_J, \mathcal{R}_J \subseteq [1:N] \setminus \bigcup_{j=1}^{J-1} G_j^{opt}}$$
$$\sum_{i \in I} \left( I\left(U_i; \mathcal{L}_i^b\left(\bigcup_{j=1}^{J-1} G_j^{opt} \cup \mathcal{G}_j\right)\right) - \right.$$
$$\left. I(U_i; \mathcal{L}_i^e(\mathcal{G}_j^{opt} \cup \mathcal{G}_J) \mid C_{max}^e)\right)^+$$
$$\text{subject to } I\left(U_i; \mathcal{L}_i^e\left(\bigcup_{j=1}^{J-1} G_1^{opt} \cup \mathcal{Z}_J\right) \mid C_{max}^e\right) < \delta_{Th}^e,$$
$$\forall i \in I$$

[Equation 64]

In addition, a simplified secure HARQ scheme for decreasing complexity of the operations is described.

4.4 Simplified Secure HARQ Scheme 1B

The simplified secure HARQ scheme 1B is conceptually similar to the aforementioned simplified secure HARQ scheme 1A. However, all random bits are included in a first packet in the simplified secure HARQ scheme 1A, whereas only minimum random bits required for security communication are included in each packet in the simplified secure HARQ scheme 1B.

Figure 17:
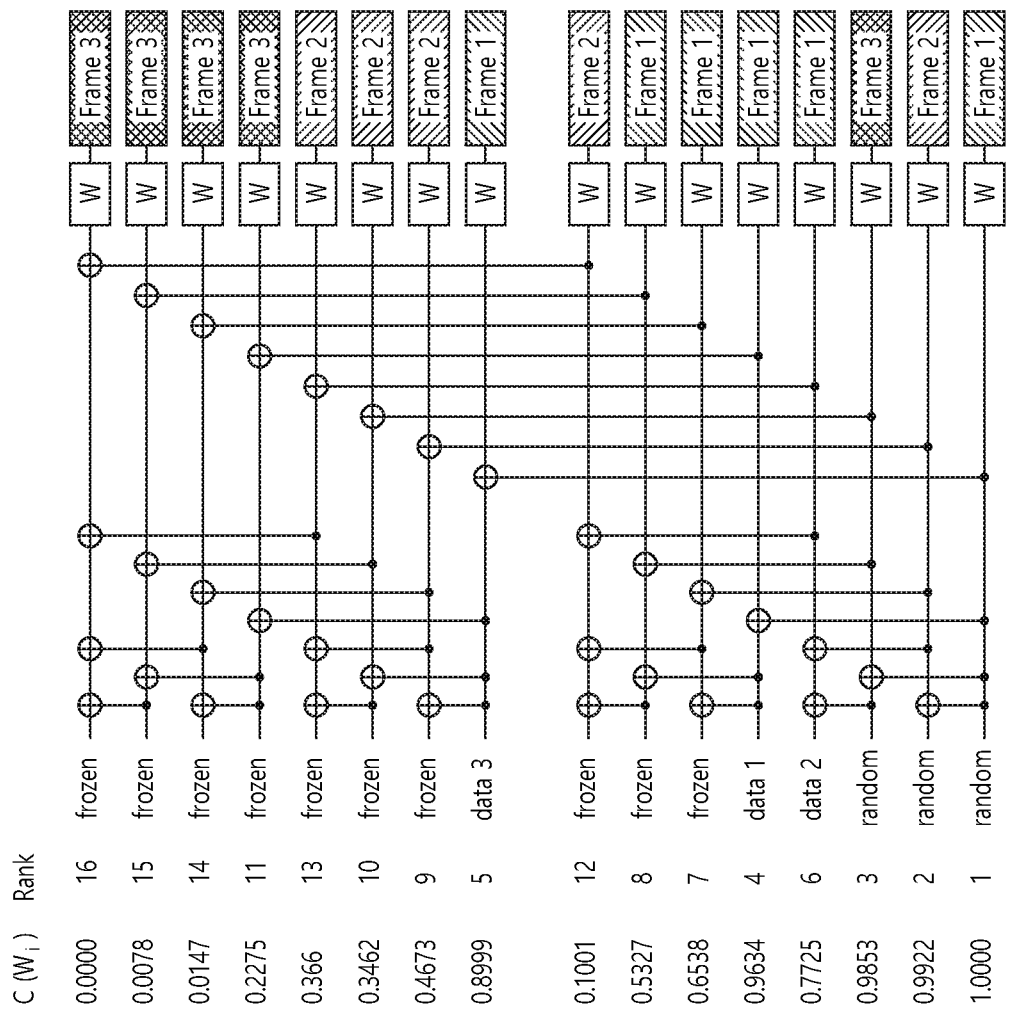
FIG. 17 shows an example of transmission according to a simplified secure HARQ scheme 1B.
Figure 18:
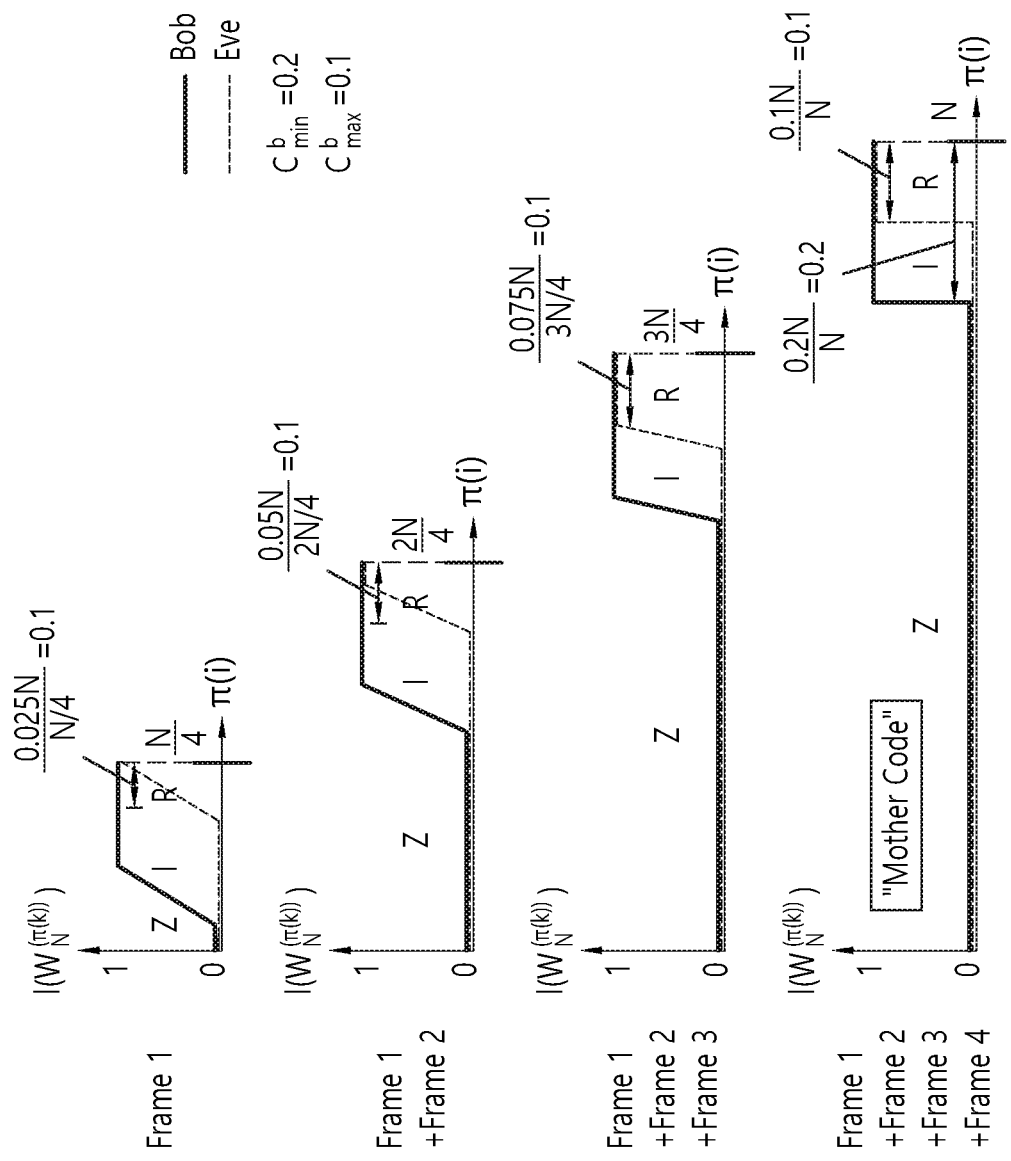
FIG. 18 is a conceptual view for explaining concept of a simplified secure HARQ scheme 1B.

FIG. 17 shows an example of transmission according to the simplified secure HARQ scheme 1B. In addition, FIG. 18 is a conceptual view for explaining concept of the simplified secure HARQ scheme 1B.

A first group may be configured as follows.

$$\mathcal{G}_1 = [\underbrace{i_{\beta_1}, i_{\beta_1+1}, \ldots, i_{\hat{b}}}_{M_1-K-(N-\alpha_1+1) \text{ zeros}},$$
$$\underbrace{i_{\hat{b}+1}, i_{\hat{b}+2}, \ldots, i_{\hat{e}-1}}_{\text{all } K \text{ info bits}}, \underbrace{i_\alpha, i_{\alpha_1+1}, \ldots, i_N}_{\text{all } (N-\alpha_1+1) \text{ random bits}}]$$ [Equation 65]

Herein, $\beta_1 = \hat{b} - (M_1 - K - N + \alpha_1)$, and the number $i_{\alpha_1}$ of minimum random bits for the first group required for security communication may be determined as follows.

$$i_{\alpha_1} = \min_{i \in [i_{\hat{e}}: i_N]} i \text{ subject to } I(U_i; \mathcal{L}_i^e(\mathcal{G}_1) \mid C_{max}^e) \geq \delta_{Th}^e$$ [Equation 66]

If $K+(N-\alpha_1+1)$ is greater than $M_1$, security communication is impossible. In this case, the value $M_1$ must be increased.

A second group may be configured as follows.

$$\mathcal{G}_2 = [\underbrace{i_{\beta_2}, i_{\beta_2+1}, \ldots, i_{\beta_1-1}}_{M_2-(\alpha_1-\alpha_2) \text{ zeros}}, \underbrace{i_{\alpha_2}, i_{\alpha_2+1}, \ldots, i_{\alpha_1-1}}_{(\alpha_1-\alpha_2) \text{ random bits}}]$$ [Equation 67]

Herein, $\beta_2 = \beta_1 - (M_2 - \alpha_1 + \alpha_2)$. The number $i_{\alpha_2}$ of minimum random bits for the second group required for security communication may be determined as follows.

$$i_{\alpha_2} = \min_{i \in [i_{\hat{e}}: i_{\alpha_1}-1]} i \text{ subject to } I(U_i; \mathcal{L}_i^e(\mathcal{G}_1 \cup \mathcal{G}_2) \mid C_{max}^e) \geq \delta_{Th}^e$$ [Equation 68]

By repeating the operation, a last $J^{th}$ group may be configured as follows.

$$\mathcal{G}_J = [\underbrace{i_1, i_2, \ldots, i_{\beta_{J-1}-1}}_{M_J-(\alpha_{J-1}-\alpha_J) \text{ zeros}}, \underbrace{i_{\alpha_J}, i_{\alpha_J+1}, \ldots, i_{\alpha_{J-1}-1}}_{(\alpha_{J-1}-\alpha_J) \text{ random bits}}]$$ [Equation 69]

The number $i_{\alpha_J}$ of minimum random bits for the $J^{th}$ group required for security communication may be determined as follows.

$$i_{\alpha_J} = \arg\min_{i \in [i_{\hat{e}}: i_{\alpha_{J-1}}-1]} i \text{ subject to } I\left(U_i; \mathcal{L}_i^e\left(\bigcup_{j=1}^J \mathcal{G}_j\right) \middle| C_{max}^e\right) \geq \delta_{Th}^e$$ [Equation 70]

An example and concept for the secure HARQ scheme 1A described according to Equations 65 to 70 are as shown in FIG. 17 and FIG. 18.

Complexity required in optimization for the aforementioned simplified secure HARQ scheme 1B is not high, and performance of the simplified secure HARQ scheme 1B is better than the simplified secure HARQ scheme 1A. However, the simplified secure HARQ scheme 1A has lower complexity since no optimization is required.

4.5 Secure HARQ Scheme 2

It is not possible to construct secure HARQ based on the aforementioned non-secure HARQ scheme 2. This is because the non-secure HARQ scheme 2 improves reliability of existing information bits by transmitting an additional packet after information bits and frozen bits are optimized based on a first packet. If the non-secure HARQ scheme 2 is extendedly applied to the secure HARQ scheme, reliability of the existing information bits is improved, and thus a decoding error probability may be decreased from a viewpoint of Bob, whereas security is lowered from a viewpoint of Eve.

4.6 Secure HARQ Scheme 3

Secure HARQ may be constructed based on the aforementioned non-secure HARQ scheme 3. The non-secure HARQ scheme is similar to the non-secure HARQ scheme 1 in a sense that a mother code is constructed and the constructed mother code is punctured. However, the non-secure HARQ scheme 1 performs puncturing after locations of an information bit and a frozen bit are optimized, whereas the non-secure HARQ scheme 3 optimizes the locations of the information bit and the frozen bit after performing puncturing. Similarly thereto, the secure HARQ scheme 3 may be performed by optimizing the locations of the information bit and the frozen bit after constructing the mother code and puncturing the constructed mother code so as to be a code having a desired length.

Figure 19:
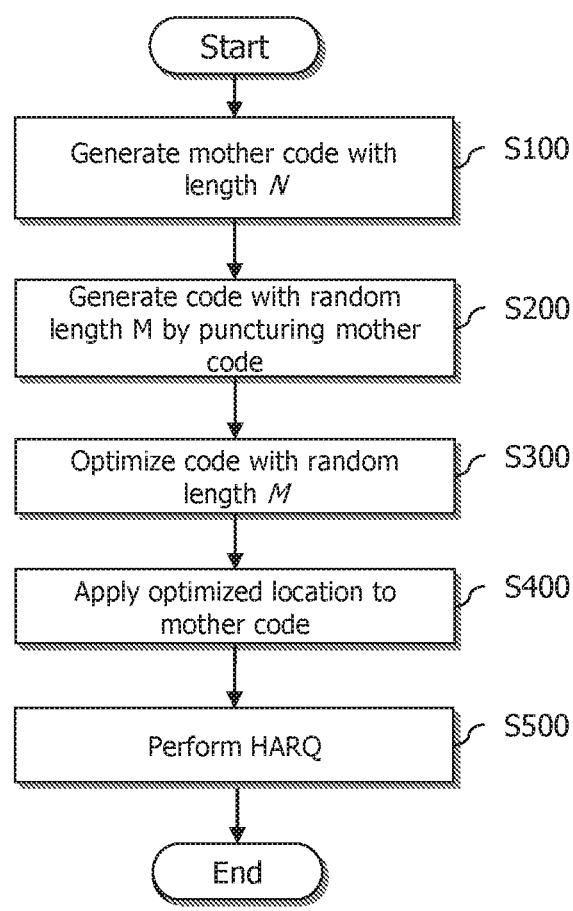
FIG. 19 is a flowchart showing a method of performing HARQ by using a polar code having a random length according to an embodiment of the present invention.

FIG. 19 is a flowchart showing a method of performing HARQ by using a polar code having a random length according to an embodiment of the present invention.

Referring to FIG. 19, a transmitter (Alice) generates a mother code having a length N (S100). Specifically, the transmitter generates a mother code including an information bit constituting data to be transmitted and a frozen bit irrelevant to data to be transmitted.

The transmitter generates a code having a random length M by puncturing the mother code (S200). Specifically, the transmitter may calculate mutual information on the basis of a probability distribution of LLR for the mother code, and may puncture the mother code so that a loss of the calculated mutual information is decreased. In this case, the probability distribution of LLR may be calculated by using Gaussian approximation. In this case, a ratio (i.e., a transfer rate) of an information bit and frozen bit included in the code having the random length M may be determined by a previously received indication signal or may be predetermined.

The transmitter optimizes the code having the random length M (S300). Specifically, the transmitter determines locations of an information bit and a frozen bit in the code having the random length M so that a variance of the mutual information for the information bit and the frozen bit is maximized In addition, the transmitter applies the locations of the optimized information bit and frozen bit to the mother code (S400). In addition, the transmitter performs HARQ by using a packet generated by splitting the mother code (S500). Specifically, the transmitter transmits a next packet upon receiving NACK from a receiver, and performs HARQ by constructing a new mother code upon receiving ACK from the receiver.

The aforementioned embodiments of the present invention can be implemented through various means. For example, the embodiments of the present invention can be implemented in hardware, firmware, software, combination of them, etc. Details thereof will be described with reference to the drawing.

Figure 20:
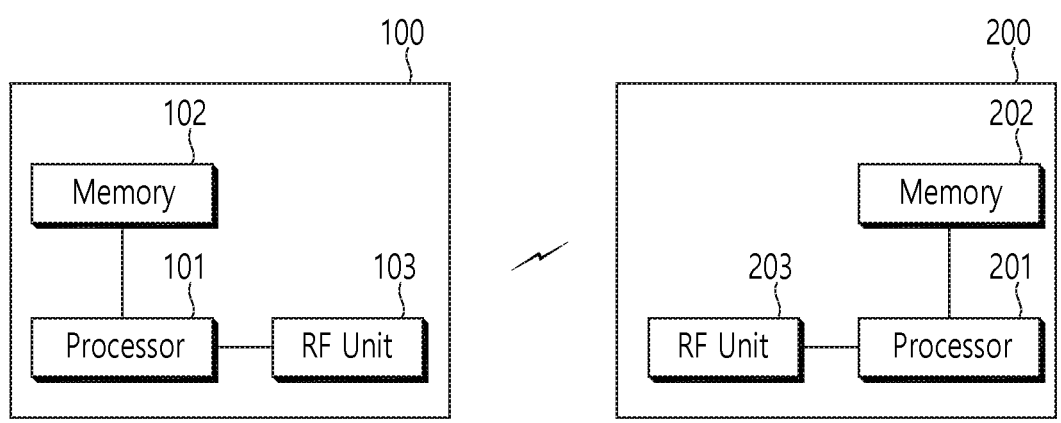
FIG. 20 is a block diagram illustrating a wireless communication system in which the present disclosure is implemented.

FIG. 20 is a block diagram illustrating a wireless communication system in which the present disclosure is implemented.

The transmitter (Alice) 200 includes a processor 201, a memory 202, and a radio frequency (RF) unit 203. The memory 202 is connected to the processor 201 to store various information for driving the processor 201. The RF unit 203 is connected to the processor 201 to transmit and/receive a wireless signal. The processor 201 implements a suggested function, procedure, and/or method. An operation of the base station 200 according to the above embodiment may be implemented by the processor 201.

The receiver (Bob) 100 includes a processor 101, a memory 102, and an RF unit 103. The memory 102 is connected to the processor 101 to store various information for driving the processor 101. The RF unit 103 is connected to the processor 101 to transmit and/receive a wireless signal. The processor 101 implements a suggested function, procedure, and/or method. An operation of the wireless 100 according to the above embodiment may be implemented by the processor 101.

A processor may include an application-specific integrated circuit (ASIC), another chipset, a logic circuit, and/or a data processor. A memory may include read-only memory (ROM), random access memory (RAM), a flash memory, a memory card, a storage medium, and/or other storage devices. An RF unit may include a baseband circuit to process an RF signal. When the embodiment is implemented, the above scheme may be implemented by a module (procedure, function, and the like) to perform the above function. The module is stored in the memory and may be implemented by the processor. The memory may be located inside or outside the processor, and may be connected to the processor through various known means.

In the above exemplary system, although methods are described based on a flowchart including a series of steps or blocks, the present invention is limited to an order of the steps. Some steps may be generated in the order different from or simultaneously with the above other steps. Further, it is well known to those skilled in the art that the steps included in the flowchart are not exclusive but include other steps or one or more steps in the flowchart may be eliminated without exerting an influence on a scope of the present invention.

What is claimed is:

1. A method of performing a hybrid automatic repeat request (HARQ) based on physical layer security, the method comprising:
   generating a second code having a length different from that of a first code by puncturing the first code, the second code comprising an information bit constituting data to be transmitted and a non-information bit irrelevant to the data to be transmitted;
   determining a location of the information bit and a location of the non-information bit in the second code;
   applying the determined locations of the information bit and non-information bit determined based on the second code to the first code; and
   performing the HARQ by using a packet generated by splitting the first code,
   wherein in the generating of the second code, mutual information is calculated based on a probability distribution of a log likelihood ratio (LLR) for the first code, and the first code is punctured to decrease a loss of the calculated mutual information,
   wherein the probability distribution of the LLR is calculated by using Gaussian approximation, and
   wherein a ratio of the information bit and non-information bit in the second code is determined by an indication signal previously received.

2. The method of claim 1, wherein in the determining of the locations of the information bit and the non-information bit, the locations of the information bit and the non-information bit are determined to minimize a variance of mutual information for each of the information bit and the non-information bit.

3. An apparatus for performing a hybrid automatic repeat request (HARQ) based on physical layer security, the apparatus comprising:
   a transmitter and a receiver capable of transmitting and receiving a radio signal, respectfully; and
   a processor controlling the transmitter and receiver, wherein the processor is configured to:
   generate a second code having a length different from that of a first code by puncturing the first code, the second code comprising an information bit constituting data to be transmitted and a non-information bit irrelevant to the data to be transmitted;
   determine a location of the information bit and a location of the non-information bit in the second code;
   apply the determined locations of the information bit and non-information bit determined based on the second code to the first code; and
   perform the HARQ by using a packet generated by splitting the first code,
   wherein the processor is configured to calculate mutual information on the basis of a probability distribution of a log likelihood ratio (LLR) for the first code, and puncture the first code to decrease a loss of the calculated mutual information,
   wherein the probability distribution of the LLR is calculated by using Gaussian approximation, and
   wherein a ratio of the information bit and non-information bit in the second code is determined by an indication signal previously received.

4. The apparatus of claim 3, wherein the processor is configured to determine the locations of the information bit and the non-information bit to minimize a variance of mutual information for each of the information bit and the non-information bit.

* * * * *